(12) United States Patent
Akiyama

(10) Patent No.: US 6,767,593 B2
(45) Date of Patent: Jul. 27, 2004

(54) APPARATUS AND PROCESS FOR FORMING A DEPOSITED FILM

(75) Inventor: Kazuyoshi Akiyama, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/691,519

(22) Filed: Oct. 24, 2003

(65) Prior Publication Data

US 2004/0079288 A1 Apr. 29, 2004

Related U.S. Application Data

(62) Division of application No. 08/797,829, filed on Feb. 10, 1997, now Pat. No. 6,712,019.

(30) Foreign Application Priority Data

Feb. 8, 1996 (JP) .............................. 8-046773
Apr. 23, 1996 (JP) ............................. 8-126452

(51) Int. Cl.$^7$ ............................ H05H 1/46; H05H 1/02; C23C 16/509
(52) U.S. Cl. .................... 427/569; 427/570; 118/723 E
(58) Field of Search ................................ 427/569, 570, 427/571, 572, 573, 574, 575, 576, 577, 578, 579, 488, 489, 490, 491, 535, 536, 537, 538, 539; 118/723 E, 723 ER, 723 I, 723 IR

(56) References Cited

U.S. PATENT DOCUMENTS

| | | | |
|---|---|---|---|
| 4,265,991 A | 5/1981 | Hirai et al. .................... 430/64 |
| 4,788,120 A | 11/1988 | Shirai et al. .................. 430/66 |
| 5,382,311 A | 1/1995 | Ishikawa et al. .......... 118/723 E |
| 5,405,448 A | 4/1995 | Jost et al. ................ 118/723 E |
| 5,414,324 A | 5/1995 | Roth et al. ............... 118/723 E |
| 5,433,790 A | 7/1995 | Niino et al. ................. 118/723 |
| 5,443,689 A | 8/1995 | Kimura et al. ........... 118/723 E |
| 5,447,595 A | 9/1995 | Nakagawa .............. 118/723 E |
| 5,472,509 A | 12/1995 | Hiroshi .................... 118/723 E |
| 5,500,256 A | 3/1996 | Watabe .................... 118/723 E |
| 5,512,510 A | 4/1996 | Murayama et al. ...... 118/723 E |
| 5,520,142 A | 5/1996 | Ikeda et al. ............... 115/723 E |
| 5,523,261 A | 6/1996 | Sandhu .................... 118/723 E |
| 5,569,350 A | 10/1996 | Osada et al. ............. 118/723 E |
| 5,591,268 A | 1/1997 | Usui et al. ............... 118/723 E |
| 5,605,576 A | 2/1997 | Sasaki et al. ............. 118/723 E |
| 5,653,812 A | 8/1997 | Petrmichl et al. ........ 118/723 E |
| 5,665,166 A | 9/1997 | Deguchi et al. ......... 118/723 E |

*Primary Examiner*—Marianne Padgett
(74) *Attorney, Agent, or Firm*—Fitzpatrick, Cella, Harper & Scinto

(57) ABSTRACT

A deposited film-forming apparatus comprising a reaction chamber capable of being vacuumed in which glow discharge is caused by means of a high frequency power supplied by a high frequency power introduction means to form a deposited film on a substrate positioned in said reaction chamber, wherein said high frequency power introduction means comprises an insulating material as a base constituent and has a region isolated from a glow discharge zone of said reaction chamber by means of said insulating material wherein an electrode comprising an electrically conductive metallic material having a thickness capable of sufficiently transmitting said high frequency power is disposed in said region such that it is contacted with said insulating material in a state with no clearance. A deposited film-forming process using said deposited film-forming apparatus.

8 Claims, 22 Drawing Sheets

F I G. 9(a)
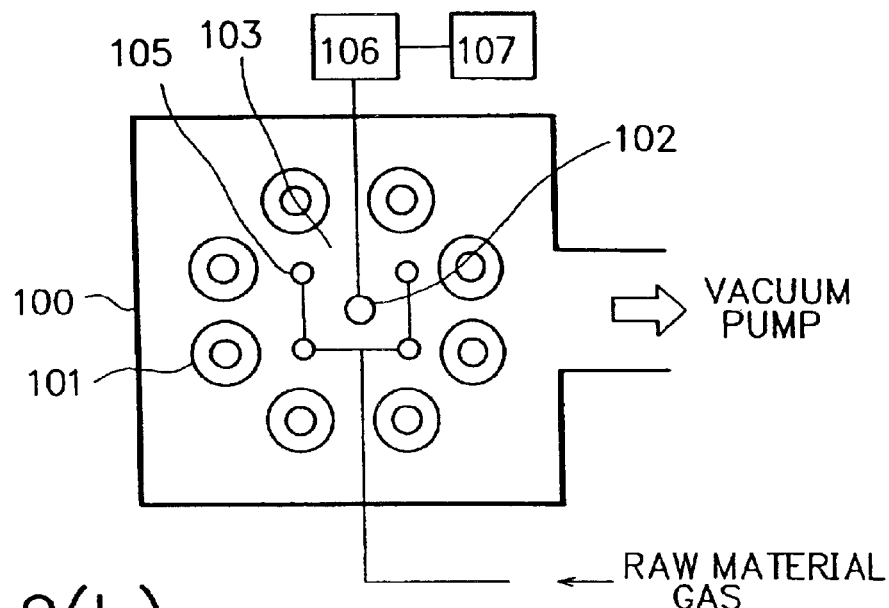
F I G. 9(b)
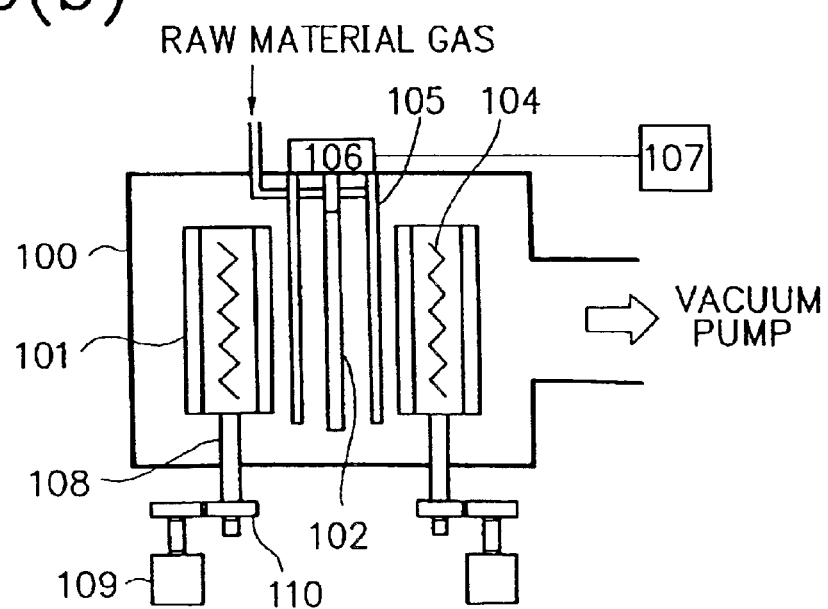

F I G. 21
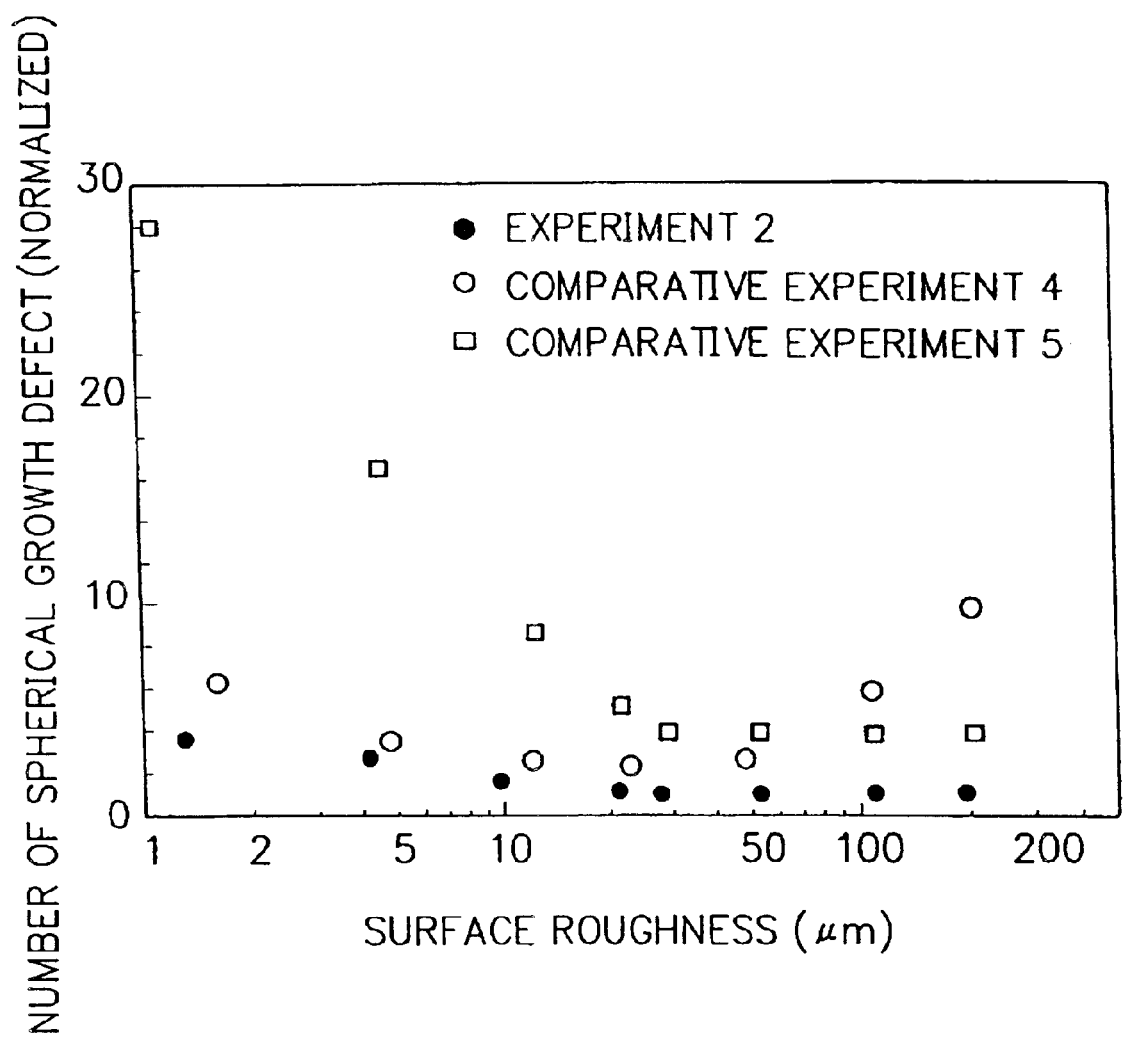

APPARATUS AND PROCESS FOR FORMING A DEPOSITED FILM

CROSS-REFERENCE TO RELATED APPLICATIONS

This application is a division of application Ser. No. 08/797,829, filed Feb. 10, 1997, now U.S. Pat. No. 6,712,019, issued Mar. 30, 2004.

BACKGROUND OF THE INVENTION

1. Field of the Invention

The present invention relates to an apparatus and process which enables to efficiently form a deposited film including a functional deposited film such as an amorphous semiconductor film usable in various devices such as semiconductor device, electrophotographic light receiving member, image-input line sensor, image pickup device and photovoltaic device, on a given substrate by way of plasma CVD process.

2. Related Background Art

In recent years, there have been proposed a number of deposited films comprising amorphous materials such as amorphous silicons, e.g., amorphous silicons in which dangling bonds are compensated by hydrogen atoms or/and halogen atoms, usable as semiconductors in semiconductor devices, electrophotographic light receiving members, image-input line sensors, image pickup devices, photovoltaic devices, or other electronic elements. Some of these deposited films have been practically using in these devices, members-or elements.

By the way, in the image-forming industrial field, for the photoconductive material to constitute a light receiving layer in an electrophotographic light receiving member, it is required to be highly sensitive, to have a high S/N ratio (photo-current (Ip)/dark current (Id)), to have absorption spectrum characteristics suited for an electromagnetic wave to be irradiated, to be quickly responsive and to have a desired dark resistance. It is also required not to harm living things, especially humans, upon use.

Particularly for electrophotographic light receiving members used in an electrophotographic apparatus which is used as a business machine at the office, causing no pollution is highly important.

From these standpoints, public attention has been focused on a-Si series light receiving members comprising amorphous silicon (a-Si) materials, for example, as disclosed in U.S. Pat. No. 4,265,991 which discloses an electrophotographic light receiving having a photoconductive layer constituted by an a-Si material and which excels in moisture resistance, durability, and electric and photoconductive characteristics.

Besides, U.S. Pat. No. 4,788,120 discloses an electrophotographic light receiving member having a surface protective layer constituted by an amorphous material containing silicon atoms, carbon atoms, and hydrogen atoms in an amount of 41 to 70 atomic %.

Based on these techniques, there has been realized a desirable a-Si series electrophotographic light receiving constituted by an a-Si material, which is satisfactory in electric, optical and photoconductive characteristics, use environmental characteristics and durability, and enables to provide a high quality reproduced image.

In order to effectively produce such a desirable a-Si series electrophotographic light receiving member, an advanced technique is required. Particularly, for an a-Si series electrophotographic light receiving member, it is necessary to have a greater area and thickness in comparison with other devices and because of this, not only to ensure uniformity but also to prevent abnormal film growth due to a nucleus comprising a foreign matter during the deposition of an a-Si film are important factors.

In view of this, there are various proposals for stably and efficiently producing a high quality a-Si series electrophotographic light receiving member on an industrial scale.

Incidentally, in the production of an a-Si series electrophotographic light receiving member, there has been pointed out the occurrence of a spherical growth defect which becomes a cause of entailing a defective image comprising a so-called "minute blank area" on an image reproduced. In most cases, such spherical growth defect is considered to occur due to abnormal film growth based on a particle generated when a film deposited on a inner face of a deposition chamber is removed.

Separately, for an electrophotographic light receiving member produced by a conventional manner, there has been pointed out a problem in that unevenness in density is sometimes occurred for an image reproduced.

In order to solve these problems, there are also various proposals.

Specifically, for example, Japanese Unexamined Patent Publication No. 4183871/1992 discloses a deposited film-forming process using a microwave plasma CVD apparatus having a microwave introduction means with two different regions.

This document describes that by making the microwave introduction means to have a face, which is to be contacted with plasma generated upon film formation, such that has a value of $2 \times 10^{-2}$ or less in terms of a product of dielectric constant ($\in$) and dissipation factor ($\tan\delta$) with respect to the frequency of a microwave used, stable discharge can be caused while preventing a film deposited on an inner face of a deposition chamber where a deposited film having an improved uniformity and which does not entail a defect for an image reproduced. The publication illustrates a technique of coating a microwave introduction means with an alumina ceramic by way of a plasma spraying process. According to the technique described in the above document, it is possible to form a high quality deposited film with few spherical growth defects.

Now, in recent years, there is an increased demand for an electrophotographic apparatus which provides a high quality reproduced image at a high speed. In addition, there is an increased demand for the electrophotographic apparatus having reduced frequency of maintenance by improving the reliability of its constituents.

Particularly, in the production of a light receiving member produced by the conventional deposited film-forming apparatus, light receiving members are liable to entail a minute blank area due to the foregoing spherical growth defect or a minute black area on a reproduced image, depending upon the film-forming conditions employed. Further, depending upon the film-forming conditions employed, there is an occasion in that there is afforded an light receiving member which is liable to entail an uneven density image on a reproduced image.

It becomes more important to eliminate these defects occurring on the reproduced image as the image-forming speed and detail of the reproduced image increase.

Herein, it should be noted that such defect or unevenness in the deposited film also affects the production of other semiconductor devices.

SUMMARY OF THE INVENTION

A principal object of the present invention is to eliminate the foregoing problems in the prior art and to provide a plasma CVD apparatus and process which enable efficiently forming a high quality deposited film having improved characteristics by stably generating uniform plasma while uniformly supplying a high frequency power without localizing the high frequency power and the plasma.

Another object of the present invention is to provide a plasma CVD apparatus and process which enable efficiently forming a high quality deposited film by uniformly growing a film deposited while preventing the occurrence of abnormal film growth and while diminishing the occurrence of the spherical growth defect (which results in entailing a defect such as minute blank area or black dot on a reproduced image) found in the prior art.

A further object of the present invention is to provide a plasma CVD apparatus and process which enable efficiently forming a high quality, highly homogeneous deposited film over the entire surface of a substrate, which is suitable particularly for use in an electrophotographic light receiving member by stably generating uniform plasma without the plasma being localized.

A further object of the present invention is to provide a deposited film-forming apparatus comprising a reaction chamber capable of being evacuated in which glow discharge is caused by means of a high frequency power to form a deposited film on a substrate, wherein said high frequency power is introduced by an insulating material as a base constituent having a region isolated from a glow discharge zone wherein an electrically conductive metallic electrode having a thickness capable of sufficiently transmitting high frequency power is disposed such that it contacts the insulating material.

A further object of the present invention is to provide a deposited film-forming process by introducing a raw material gas and a high frequency power into the above apparatus.

BRIEF DESCRIPTION OF THE DRAWINGS

FIG. 9 (FIGS. 9(a) and 9(b)) and FIG. 22 (FIGS. 22(a) and 22(b)) are schematic diagrams illustrating a deposited film-forming apparatus according to the present invention.

FIG. 15 and FIG. 21 are graphs showing spherical growth defects which can occur in film formation.

DETAILED DESCRIPTION OF THE PRESENT INVENTION

Figure 1:
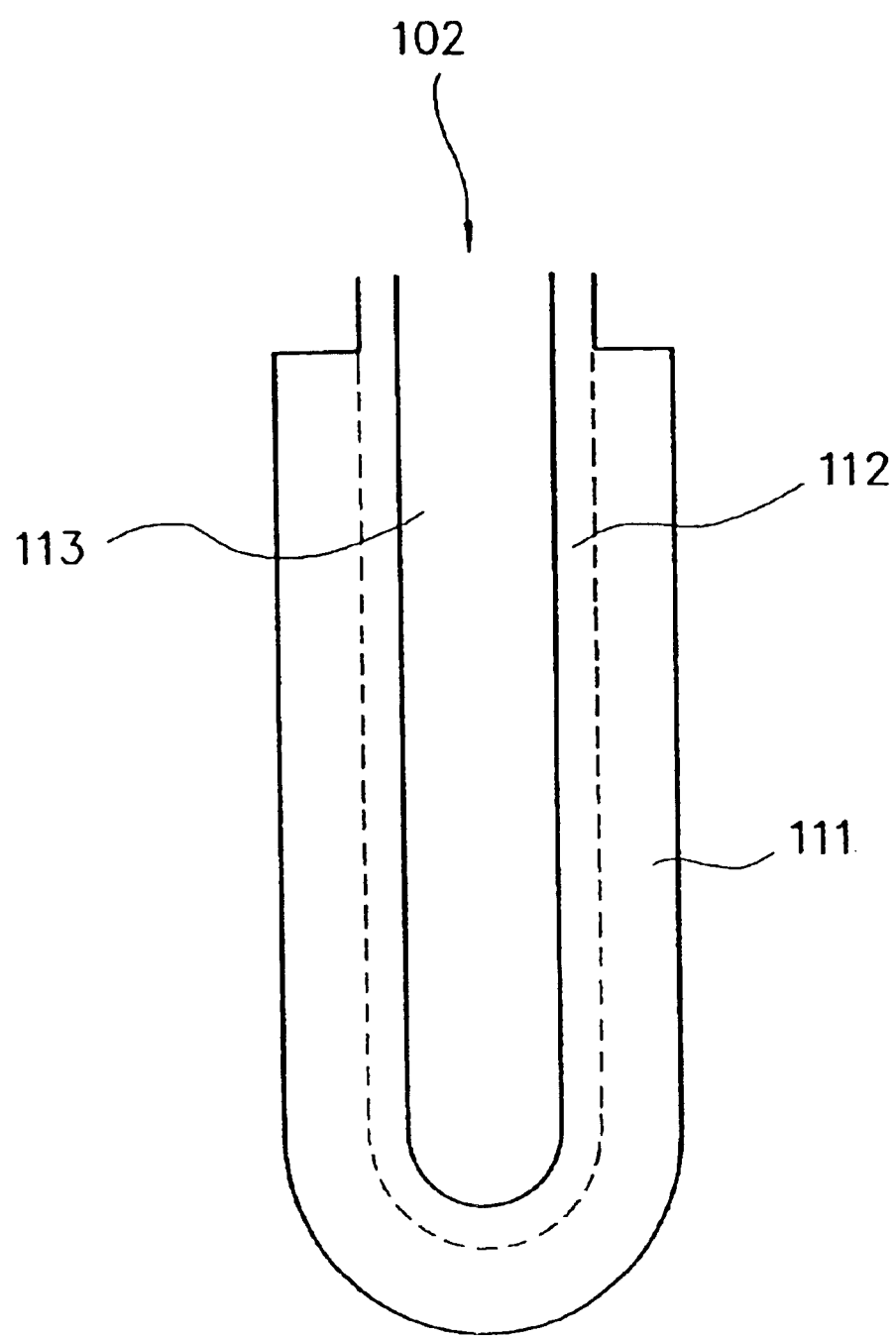
FIG. 1, FIG. 2, FIG. 3, FIG. 4 (FIGS. 4(a) and 4(b)), and FIG. 8 are schematic cross-sectional views illustrating high frequency power introduction means of the present invention.

An aspect of the present invention is directed to a deposited film-forming apparatus comprising a reaction chamber capable of being evacuated in which glow discharge is caused by means of a high frequency power supplied by a high frequency power introduction means to form a deposited film on a substrate positioned in said reaction chamber, wherein said high frequency power introduction means comprises an insulating material as a base constituent and has a region isolated from a glow discharge zone of said reaction chamber by means of said insulating material wherein an electrode comprising an electrically conductive metallic material having a thickness capable of sufficiently transmitting said high frequency power is disposed in said region such that it is contacted with said insulating material in a state with no clearance.

Another aspect of the present invention is directed to a deposited film-forming process comprising introducing a raw material gas and a high frequency power into a reaction chamber capable of being vacuumed and containing a substrate positioned therein to cause glow discharge by means of said high frequency power whereby forming a deposited film on said substrate, wherein the introduction of said high frequency power into said reaction chamber is conducted by a high frequency power introduction means comprising an insulating material as a base constituent and having a region isolated from a glow discharge zone of said reaction chamber by means of said insulating material wherein an electrode comprising an electrically conductive metallic material having a thickness capable of sufficiently transmitting said high frequency power is disposed in said region such that it is contacted with said insulating material in a state with no clearance.

For the metallic material (having the thickness capable of sufficiently transmitting high frequency power) which is contacted with the insulating material in the present invention, it is desired to be configured so that impedance is made to be discontinuous. Specifically, it may take a configuration in which the high frequency power propagation path is partly branched into plural portions, a configuration in which a part of the high frequency power propagation path is turned up, or a coil-like configuration.

The insulating material as the base constituent of the high frequency power introduction means (this will be hereinafter referred to as "insulating base material") may be ceramic. The ceramic can include alumina ceramics.

In the present invention, it is possible to use a mechanism for cooling or heating the high frequency power introduction means.

The high frequency power introduction means in the present invention may be designed such that it serves also as a raw material gas introduction means.

For the insulating base material constituting the high frequency power introduction means, it has a portion to be exposed to glow discharge and said portion is desired to have a surface roughness of 5 µm to 200 µm in terms of JIS ten-point average roughness (RZ) under JIS B0601.

In the present invention, as the high frequency power, it is desired to use a high frequency power with an oscillation frequency of 20 MHz to 450 MHz.

In the present invention, by forming an electrode in a region isolated from the glow discharge zone in a contacted state by means of the insulating base material as above described, the occurrence of the foregoing spherical growth defect in a film deposited can be efficiently prevented, whereby there can be attained the formation of a high quality deposited film which can be desirably used, for example, in an electrophotographic light receiving member, wherein the light receiving member is substantially free of an uneven image density.

Particularly, according to the present invention, a desired high frequency power can be uniformly supplied into a film-forming space (that is, a glow discharge space) without being localized to thereby stably generate uniform plasma in the film-forming space, where the growth of a film deposited uniformly progresses over the entire surface of a substrate. Because of this, there can be efficiently formed a high quality deposited film substantially free of unevenness.

In addition, because of the specific high frequency power introduction means according to the present invention, a deposited film is difficult to remove and the occurrence of spherical growth defects is effectively prevented.

Hence, the present invention enables to effectively eliminate the problems found in the prior art. Specifically, the present invention enables concurrently preventing the resulting deposited film from having uneven characteristics as well as preventing the resulting deposited film from having minute blank areas or black dots.

In the following, description will be made of an electrophotographic light receiving member as an example.

As one of the factors to govern the yield of the electrophotographic light receiving member, there can be mentioned the occurrence of the foregoing spherical growth defect.

As a manner for preventing the occurrence of the spherical growth defect, there can be mentioned the use of a high frequency power introduction means coated by an alumina ceramic or the like by means of a plasma spraying process. The ceramic herein has a greater surface energy in comparison with a metal and therefore, the surface of the ceramic has a relatively strong adhesion with a film deposited thereon. To use this high frequency power introduction means effectively prevents layer peeling. However, this high frequency power introduction means is, by itself, not sufficiently for the following reasons.

That is, in general, on the surface of a conventional high frequency power introduction means, film deposition is occurred at a temperature which is higher than that at which film deposition is occurred on the surface of a substrate and the film deposited on the surface of the high frequency power introduction means suffers from excessive ion bombardment due to a self-bias caused by a high frequency power supplied, where a stress-strain diagram is accumulated in the deposited film whereby the deposited film is removed from the high frequency power introduction means. This layer peeling tends to become significant when the high frequency power supplied is increased.

Under such conditions, even in the case of using high frequency power introduction means coated by the alumina ceramic or the like, layer peeling of a deposited film sometimes occurs.

In order to improve the adhesion of the deposited film with the surface of the coat of the high frequency power introduction means, Applicant has considered making the surface of the coat have an increased surface roughness. However, in the case where the coat of the high frequency power introduction means is formed by means of the plasma spraying process, in order for the coat to have an increased surface roughness, it is necessary to use a spraying material having a large particle size, where the resulting coat layer becomes to have an undesirably large porosity such that the coat layer insufficiently adheres to the surface of the high frequency power introduction means and because of this, the coat layer itself is liable to peel from the high frequency power introduction means.

In view of this, the present inventor made studies of a manner of disposing a cover made of a ceramic material on a surface of an electrode as a high frequency power introduction means. As a result, he discovered that this is liable to provide a deposited film which is not homogenous. The present inventor made studies of the reason for this. As a result, he discovered that the problem is principally due to a clearance caused between the electrode and the ceramic cover.

The reasons of the interrelations among the occurrence of the formation of such non-homogenous deposited film, the electrode and the ceramic cover, are not clear at present. However, it is considered as will be described in the following.

In general, the propagation of a high frequency power is performed in a dielectric portion between two electric conductors.

Herein, consideration is made of a deposited film-forming apparatus in which a plurality of cylindrical substrates as outer electric conductors are concentrically arranged about an electrode as a high frequency power introduction means (this electrode will be hereinafter referred to as center electric conductor). In this case, in comparison with the space between the center electric conductor and each cylindrical substrate (the outer electric conductor), the space of the clearance between the electrode and the ceramic cover is negligibly small.

On the other hand, when glow discharge is occurred, plasma generated is considered to behave as a kind of electric conductor and therefore, a load impedance is greatly governed by the situation of a sheath region formed in the vicinity of the electrode. In this case, the influence of the clearance between the electrode and the ceramic cover can not be disregarded. Particularly, the glow discharge is greatly influenced by variation in the clearance between the electrode and the ceramic cover.

For instance, in the case where the clearance between the electrode and ceramic cover is not uniform due to trouble in the mechanical processing, there is an occasion in that glow discharge is markedly localized.

In addition, when the temperature of the electrode is raised during the glow discharge, the electrode is expanded to greatly change the size of the clearance present between the electrode and the ceramic cover, where the matching conditions for the glow-discharge are sometimes markedly varied.

Such localization and variation of the glow discharge not only result in making the resulting light receiving member have an unevenness in characteristics but also result in depositing a readily peelable film on the surface of the ceramic cover, where the film deposited on the surface of the ceramic cover is sometimes peeled during the film formation to cause the occurrence of a spherical growth defect in a film deposited on the substrate. This situation tends to become more apparent as the wattage of the high frequency power or the oscillation frequency thereof is increased.

To completely eliminate the clearance between the electrode and the ceramic cover is extremely difficult in practice. For instance, in the case where thermal expansion is occurred in the electrode, it is necessary to intentionally provide a certain clearance between the electrode and the ceramic cover because of a difference between their coefficients of thermal expansion. Further, in the case where the electrode and the ceramic cover are mechanically caulked, the toughness of the ceramic material constituting the ceramic cover is inferior to that of the metallic material constituting the electrode and because of this, it is necessary to intentionally provide a certain clearance between the two in order to prevent the occurrence of a damage.

Therefore, in any case, it is required to intentionally provide a certain clearance between the electrode and the ceramic cover.

Now, the results obtained as a result of experimental studies by the present inventor revealed that there is a tendency that, as the clearance between the electrode and ceramic cover is diminished, the state for glow discharge generated becomes uneven and that, as the clearance is enlarged, the loss in the high frequency power is increased.

For the reason why the resulting deposited film is not homogeneous in characteristics, it is considered principally due to unevenness in a high frequency power supplied into the plasma from a high frequency power introduction means.

In the case of a conventional high frequency power introduction means, there is a tendency in that the high frequency power irradiated becomes relatively intense at opposite end portions of the high frequency power introduction means (substantially, opposite end portions of a portion thereof to radiate a high frequency power into the plasma) and it becomes relatively weak about the central portion thereof The reason for this is considered such that high frequency powers generated on the surface of the high frequency power introduction means are multiple-reflected to influence (or interfere) with each other so as to weaken.

This tendency becomes significant as the oscillation frequency of the high frequency power is increased, for instance, in order to increase the deposition rate for a film deposited. For the reason for this, it is considered such that when the frequency of the high frequency power approximates the effective length of the high frequency power introduction means, the above described high frequency power-interfering phenomenon becomes apparent.

Separately, there is a tendency in that when the wattage of the high frequency power is increased, the power irradiated at opposite end portions of the high frequency power introduction means becomes saturated for a raw material gas, and the power irradiated at the central portion thereof is relatively increased.

The difference between the high frequency power at the central portion and that at the opposite end portions is not so large that the deposition rate for a film deposited on a substrate is influenced. But the difference appears in the saturated electron current and results in imparting a negative influence to the property of the film deposited. Particularly, there is caused a subtle difference in the photosensitivity. For instance, in the case of an electrophotographic light receiving member comprising such deposited film, there is sometimes reproduced an uneven image of a halftone original.

As previously described, the minute blank area is occurred due to the abnormal film growth based on the spherical growth defect caused by a particle released from the deposited film peeled during the film formation. For a deposited film having such spherical growth defect, there is often present a gap at the boundary between the spherical growth defect and the deposited film. In this case, a charge escapes through the gap, where charging cannot be sufficiently carried out as desired and because of this, there entails a minute blank area on an image reproduced.

In order to prevent the occurrence of the spherical growth defect, it is considered to use the foregoing high frequency power introduction means coated by an alumina ceramic or the like by means of the plasma spraying process. However, the use of this high frequency power introduction means is still problematic as previously described. Particularly in this respect, as previously described, on the surface of the conventional high frequency introduction means, film deposition is occurred at a temperature which is higher than that at which film deposition is occurred on the surface of the substrate and the film deposited on the surface of the high frequency power introduction means suffers from excessive ion bombardment due to the self-bias caused by the high frequency power supplied, where the stress-strain diagram is accumulated in the deposited film on the high frequency power introduction means whereby the deposited film is peeled. Under this condition, even when the high frequency power introduction means coated by the alumina ceramic or the like by means of the plasma spraying process is used, the film deposited on the surface of this high frequency power introduction means is liable to peel. In order to improve the adhesion of the deposited film with the surface of the coat of the high frequency power introduction means, it is considered to make the surface of the coat have an increased surface roughness. However, in the case where the coat of the high frequency power introduction means is formed by means of the plasma spraying process, in order for the coat to have an increased surface roughness, it is necessary to use a spraying material having a large particle size, where the resulting coat layer becomes to have an undesirably large porosity such that the coat layer is insufficient in adhesion with the surface of the high frequency power introduction means and because of this, the coat layer itself is liable to remove from the high frequency power introduction means. This sometimes results in increasing occurrence of a minute blank area on an image reproduced.

Now, for a deposited film formed on the substrate, the occurrence of an unevenness in characteristics based on the unevenness in the high frequency power supplied may be reduced by raising the wattage of the high frequency power. However, for an electrophotographic light receiving member comprising a deposited film formed with the use of a high frequency power of an increased wattage, the present inventor found that it is liable to provide a reproduced image accompanied by an undesirable black dot. The present inventor made examination of this electrophotographic light receiving member. As a result, the deposited film of the electrophotographic light receiving member was found to have minute upheavals at the surface thereof. Such upheaval was found to be of less than 10 $\mu$m in diameter and to have no distinct boundary thereabout as in the case of the spherical growth defect. Herein, the spherical growth defect (which entails a cause of providing a minute blank area on an image reproduced) is usually more than 10 $\mu$m in diameter.

In the case of the above-described electrophotographic light receiving member with minute upheavals, charging and charge-elimination at the portion with the minute upheavals can be normally performed at the outset where defects do not occur on a reproduced image. However, when the electrophotographic image-forming process is continuously repeated over a long period of time, toner is fuse-welded due to the upheavals, resulting in a black dot on a reproduced image.

Such upheaval is liable to occur when the high frequency power is excessively supplied during the film formation. In fact, the present inventor determined that when an electrophotographic light receiving member is produced using a high frequency power of an excessive wattage, such upheaval is liable to occur at its upper and lower portions. This fact indicates that the occurrence of such upheaval is caused when a high frequency power is excessively supplied during the film formation.

As apparent from the above description, it is understood that according to the conventional high frequency power introduction means, it is difficult to concurrently attain the prevention of the occurrence of unevenness in characteristics for a deposited film formed and the prevention of the occurrence of a minute blank area on an image reproduced at an improved level.

The present invention is based on the above analysis of the prior art.

The present invention features a specific high frequency power introduction means configured as above described and it enables to efficiently produce a desirable electrophotographic light receiving member while effectively preventing the occurrence of unevenness in characteristics for a deposited film formed so that the occurrence of a minute blank area on a reproduced image is desirably prevented.

As previously described, the high frequency power introduction means used in the present invention comprises an insulating material as the base constituent and a region isolated from a glow discharge zone of a film-forming space (or a reaction chamber) by means of said insulating material and a metallic material (serving as an electrode) having a thickness capable of sufficiently transmitting a high frequency power which is disposed in said region such that said metallic material is contacted with said insulating material. This high frequency power introduction means is free of such clearance as found in the conventional high frequency power introduction means. And in comparison with the conventional high frequency power introduction means comprising an electrode coated by an insulating material, the physical strength of the insulating in the high frequency power introduction means in the present invention is markedly greater than that of the insulating material as the coat of the conventional high frequency power introduction means. In the present invention, such problem that the coat of the high frequency power generation means is peeled to release a foreign matter in a particle form which results in forming a spherical growth defect in a deposited film does not occur. Particularly, the use of the high frequency power introduction means according to the present invention enables to generate stable discharge in a uniform state without being localized and without causing such spherical growth defect based on the foreign matter in a film deposited.

Further, the present invention is based on those findings obtained by the present inventor which will be described below.

The present inventor made experimental studies in order to establish a reliable high frequency power introduction means which can attain improved uniformalization for a high frequency power supplied. As a result, it was determined that in order to effectively prevent a high frequency power from being localized, it is effective to configure the high frequency power introduction means to have an area capable of making impedance to be discontinuous (this area will be hereinafter referred to as impedance discontinuous area).

Particularly, when the high frequency power introduction means is thus configured, a high frequency power irradiated from the high frequency power introduction means is reflected not only at opposite end portions of the high frequency power introduction means but also at the impedance discontinuous area, where the high frequency powers irradiated are prevented from influencing (or interfering) with each other to uniformalize. In addition, since the electrode (comprising an electrically conductive metallic material) is covered by the insulating material, the impedance discontinuous area effectively functions as a reflecting surface for a high frequency power and because of this, there is provided a pronounced advantage in that a high frequency power is uniformly irradiated in the film-forming space. Further, even in the case where the electrode in the high frequency power introduction means is made to have a complicated structure, the occurrence of sparking is effectively prevented because of the presence of the impedance discontinuous area.

Further in addition, in the high frequency power introduction means according to the present invention, the electrode is tightly joined to the inside of the insulating material (on the side of the space isolated from the discharge space of the film-forming space by the insulating material) in a state with no clearance between the two members, where the foregoing problem occurred in the case of using the conventional high frequency power introduction means in that the high frequency power is unevenly irradiated due to the clearance present between the insulating coat and the electrode is not occurred.

Hence, the present invention enables to effectively eliminate the foregoing problems for devices having a thin deposited film such as amorphous silicon devices which are found in the prior art.

In the following, the present invention will be described in more detail.

As previously described, the high frequency power introduction means used in the present invention comprises an insulating material as a base constituent and has a region isolated from a glow discharge zone of a film-forming space (or a reaction chamber) by means of said insulating material wherein an electrode comprising an electrically conductive metallic material capable of transmitting a high frequency power is disposed in said region such that it is contacted with said insulating material in a state with no clearance.

Herein, if necessary, the high frequency power introduction means according to the present invention may be designed so as to serve also as a raw material gas supply means.

As the insulating material constituting the high frequency power introduction means, it is desired to use an insulating material having a good adhesion with a film deposited on the surface of the high frequency power introduction means. Specific examples of such insulating material are glasses such as quartz glass, pyrex glass and the like; and ceramics such as alumina ceramics, titanium dioxide, boron nitride, zircon, cordierite, zirconcordierite, silicon oxide, beryllium oxide, mica ceramics, and the like. Of these, in view of durability and adhesion with a film deposited, ceramics are preferable. Particularly, alumina ceramics are the most preferable because they excel in durability and adhesion with a film deposited and are slight in absorption of a high frequency power.

For the insulating material as the base constituent of the high frequency power introduction means and the electrode, each of them is desired to be configured in a cylindrical form (or a circular cylinder form) in view of workability and formation easiness. And it is desired for the insulating material and the electrode to be concentrically arranged for the same reasons.

As previously described, the insulating material of the high frequency power introduction means has a surface to be exposed to the discharge zone (or the discharge space) of the film-forming space (or the reaction chamber). This surface of the insulating material may be a roughened surface provided with irregularities mainly for the purpose of preventing a film deposited thereon from being peeled.

For the roughened surface of the insulating material in this case, it is desired to be of a surface roughness of 5 μm to 200 μm in terms of JIS ten-point average roughness (RZ) under JIS B0601.

Such roughened surface may formed, for instance, by a conventional blasting process using an abrasive.

For the size of the insulating material as the base constituent of the high frequency power introduction means, there is no particular limitation.

However, in the case where the high frequency power introduction means shaped in a cylindrical form (designed so as to serve also as a raw material gas supply means) is arranged in the discharge space circumscribed by a plurality of electrically conductive cylindrical substrates spacedly arranged on a concentric circle, the size of the cylindrical insulating material (that is, the outer diameter of the cylindrical high frequency power introduction means) is desired to be of a magnitude of 4% to 25% of the diameter of the circumference where the cylindrical substrates are spacedly arranged.

For the thickness of the cylindrical insulating material, there is no particular limitation. However, in general, it is desired to be in the range of 0.5 to 20 mm in view of workability and physical strength.

For the diameter of the cylindrical electrode, there is no particular limitation as long as it matches with the diameter and thickness of the cylindrical insulating material. However, in general, it is desired to be 2 mm or more in view of practicability.

For the length, of the high frequency power introduction means, in general, it is desired to be of a magnitude of 100% to 150% of the length of a substrate on which a film is to be deposited. However, even in the case where the length of the high frequency power introduction means is of a magnitude of less than 100% of the length of the substrate, the advantages of the present invention are provided. The length of the high frequency power introduction means herein indicates an effective portion of the high frequency power introduction means which serves to substantially radiate a high frequency power into the discharge space of the film-forming space.

As previously described, the electrode of the high frequency power introduction means is constituted by an appropriate electrically conductive metallic material. The electrically conductive metallic material can include metals such as Al, Cr, Cu, Mo, Au, Ag, In, Nb, Ni, Te, V, Ti, Pt, Pb and Fe; and alloys of these metals such as stainless steel, Inconel (alloy containing Ni, Fe and Cr), Hastelloy (alloy containing Mo, Fe and Cr) (produced by the Haynes Co. Stellite), and the like.

For the thickness of the electrode, it should be determined in a range capable of sufficiently transmitting a high frequency power. Specifically, the thickness should be determined so that it is greater than a skin effect decided depending upon the oscillation frequency of a high frequency power used and the kind of an electrically conductive metallic material by which the electrode is constituted.

For instance, in the case where the oscillation frequency of the high frequency power is 105 MHz and the electrode is constituted by copper (Cu), the skin effect is about 7 μM. In this case, the thickness of the electrode is made to be 7 μm or more.

In the case where the thickness of the electrode is excessively large, when the temperature of the electrode is greatly raised, a removal is liable to occur at the interface between the electrode and the insulating material due to a difference between their coefficients of expansion. Therefore, the upper limit for the thickness of the electrode is desired to properly determined having a due care about conditions employed for film formation.

To contact the electrode with the insulating material in a state with no clearance may be conducted by an appropriate manner such as chemical plating, thermal spraying, sputtering, brazing, solid diffusion welding, plasma spraying, plasma CVD or vacuum evaporation.

In the present invention, the electrode is desired to be configured to have an impedance-discontinuing area in which the impedance is made to be discontinuous. For this purpose, an appropriate configuration may be employed as long as a desirable impedance discontinuous area is provided. Specific examples of such configuration are a configuration in which the high frequency power propagation path is partly branched into plural portions, a configuration in which a part of the high frequency power propagation path is turned up, and a coil-like configuration.

For the position for the impedance-discontinuing area to be provided, it should be determined depending upon conditions employed for film formation, so that the high frequency power introduction means irradiates a high frequency power into the discharge space in an optimally uniform state.

In the inside of the high frequency power introduction means (that is, on the side isolated from the glow discharge zone), there is occurred a cavity depending upon a combination of the size (the diameter) and thickness of the insulating material and the thickness of the electrode. This cavity may be maintained in a vacuumed state or it may be isolated from the vacuum system of the film-forming space (or the reaction chamber) by way of vacuum sealing.

In any case, it is desired to prevent a raw material gas from flowing into the inside of the high frequency power introduction means in order to prevent the raw material gas from staying therein.

It is possible for the cavity to be filled by an appropriate filling material. The filling material used in this case can include insulating materials capable of using as the constituent of the insulating material of the high frequency power introduction means, electrically conductive metallic materials capable of using as the constituent of the electrode, and synthetic resins such as polycarbonate, Teflon (trademark name), polyamide, and polyimide. The filling materials may be filled in the cavity in a state in that it contacts with the face of the electrode on the cavity side or in a state in that it has a clearance to said face. Particularly, when a problem relating to thermal expansion would occur, it is possible to provide said clearance at an appropriate magnitude of 0.1 to 5 mm. For the case where this clearance was provided, the present inventor made experimental studies. As a result, there was not observed a substantially negative influence due to the clearance, where a high frequency power was irradiated principally from a portion of the high frequency power introduction means faced to the glow discharge zone (or the discharge space) of the film-forming space.

For the number of the high frequency power introduction means used in the film-forming space, it may be one or more. In the case of conducting film formation in a system in that a plurality of electrically conductive cylindrical substrate are spacedly arranged to circumscribe a discharge space (or a glow discharge zone) by using a single high frequency power introduction means, it is desired for the high frequency power introduction means to be positioned on a coaxial line at the center of the arrangement circle of the cylindrical substrates (inside the arrangement circle of the cylindrical substrates) in order for a high frequency power to be uniformly irradiated toward every cylindrical substrate.

In the case of using a plurality of high frequency power generation means in the above system, they are desired to be spacedly arranged on a circumference concentric to the arrangement circle of the cylindrical substrates. The arrangement circle of these high frequency power introduction means in this case may be smaller or larger than the arrangement circle of the cylindrical substrates. Particularly in this respect, these high frequency power introduction means may be arranged on a circumference concentric to the arrangement circle of the cylindrical substrates at a position outside or inside the arrangement circle of the cylindrical substrates. When these high frequency power introduction means are arranged on a circumference concentric to the arrangement circle of the cylindrical substrates at a position outside the arrangement circle of the cylindrical substrates, at least one of these high frequency power introduction means is desired to be arranged at a position inside the arrangement circle of the cylindrical substrates.

Further, in the case of using two high frequency power introduction means, they may be arranged in such a state in that they are divided in a generatrix direction. The two high frequency power introduction means are desired to be positioned on a coaxial line at the center of the arrangement circle of the cylindrical substrates (inside the arrangement circle of the cylindrical substrates).

In the present invention, it is possible to use a means for heating or cooling the high frequency power introduction means. In this case, for example, by controlling the temperature of the high frequency power introduction means to a desired temperature by the heating means during film formation, the adhesion of the surface of the insulating material of the high frequency power introduction means with a film deposited thereon is improved to prevent the deposited film from peeling therefrom.

To heat or cool the high frequency power introduction means should be decided depending upon related conditions such as a combination of the kind of a film to be formed and the kind of the constituent of the insulating material of the high frequency power introduction means, the wattage of a high frequency power used, the inner pressure in the film-forming space upon film formation, the flow rate of a raw material gas introduced into the film-forming space, and the like.

As previously described, the high frequency power introduction means according to the present invention may be designed so that it can serve also as a raw material gas supply means. In this case, the insulating material of the high frequency power introduction means may be configured to have a gas flow pathway and one or more gas release holes communicated with the gas flow pathway wherein the gas flow path way is connected to a raw material gas supply system containing gas reservoirs. In this case, a raw material gas from the raw material gas supply system passes through the gas flow pathway of the insulating material and flows into the discharge space from the gas release hole(s).

In the film formation in the present invention, a high frequency power of a given wattage is supplied by the high frequency power introduction means into the discharge space containing a raw material gas to generate glow discharge thereby causing plasma, where the raw material gas is decomposed to cause the formation of a deposited film on a substrate.

For the oscillation frequency of a high frequency power used in the present invention, there is no particular limitation. However, the results obtained as a result of experimental studies by the present inventor provided the following findings. That is, when a high frequency power with an oscillation frequency of less than 20 MHz is used, there is occasionally caused unstable glow discharge under certain film-forming conditions and therefore, there is a limitation for the film-forming conditions to be employed. And when a high frequency power with an oscillation frequency of beyond 450 MHz is used, there is a tendency for the transmission characteristic of the high frequency power to be deteriorated so that glow discharge is difficult to be generated.

In this respect, to use a high frequency power with an oscillation frequency in the range of from 20 MHz to 450 MHz is the most desirable.

For the wattage of a high frequency power used in the present invention, it should be determined depending upon the characteristics or the like desired for a deposited film to be formed. However, in general, it is desired to be preferably in the range of from 10 W to 5000 W, more preferably in the range of from 20 W to 2000 W per one substrate.

In the following, description will be made of a deposited film-forming apparatus according to the present invention with reference to the drawings.

FIG. 1 is a schematic cross-sectional view in a generatrix direction of a preferable example of a high frequency power introduction means according to the present invention.

In FIG. 1, reference numeral 102 indicates a high frequency power introduction means shaped in a cylindrical form which comprises a cylindrical insulating material 111 and an electrode 112.

A space (with no reference numeral) outside the insulating material 111 is a glow discharge zone (or a discharge space) of a film-forming space (or a reaction chamber).

As apparent from FIG. 1, the electrode 112 is formed on an inside face of the insulating material 111 (that is, on a surface of the insulating material on the side of a region 113 isolated from the glow discharge zone) such that the electrode 112 is joined with the inside face of the insulating material 111 in a state with no clearance.

The region 113 (comprising a cavity) is formed inside the electrode 112 and is isolated from the glow discharge zone (the region will be hereinafter referred to as isolated region). The region 113 (the cavity) is isolated from the vacuum system of the film-forming space by a vacuum sealing means (not shown) so that no raw material gas is flown therein.

The upper tip of the electrode 112 is electrically connected through a high frequency power input terminal (not shown) to a high frequency power source provided with a high frequency power transmission circuit (not shown).

In the embodiment shown in FIG. 1, the lower tip of the insulating material 111 (that is, the tip of the insulating material 111 on the side where no high frequency power input terminal is present) has a closed structure as shown in FIG. 1. However, this is not restrictive. It is possible to take a configuration with open opposite ends, for instance, a cylindrical configuration.

Figure 2:
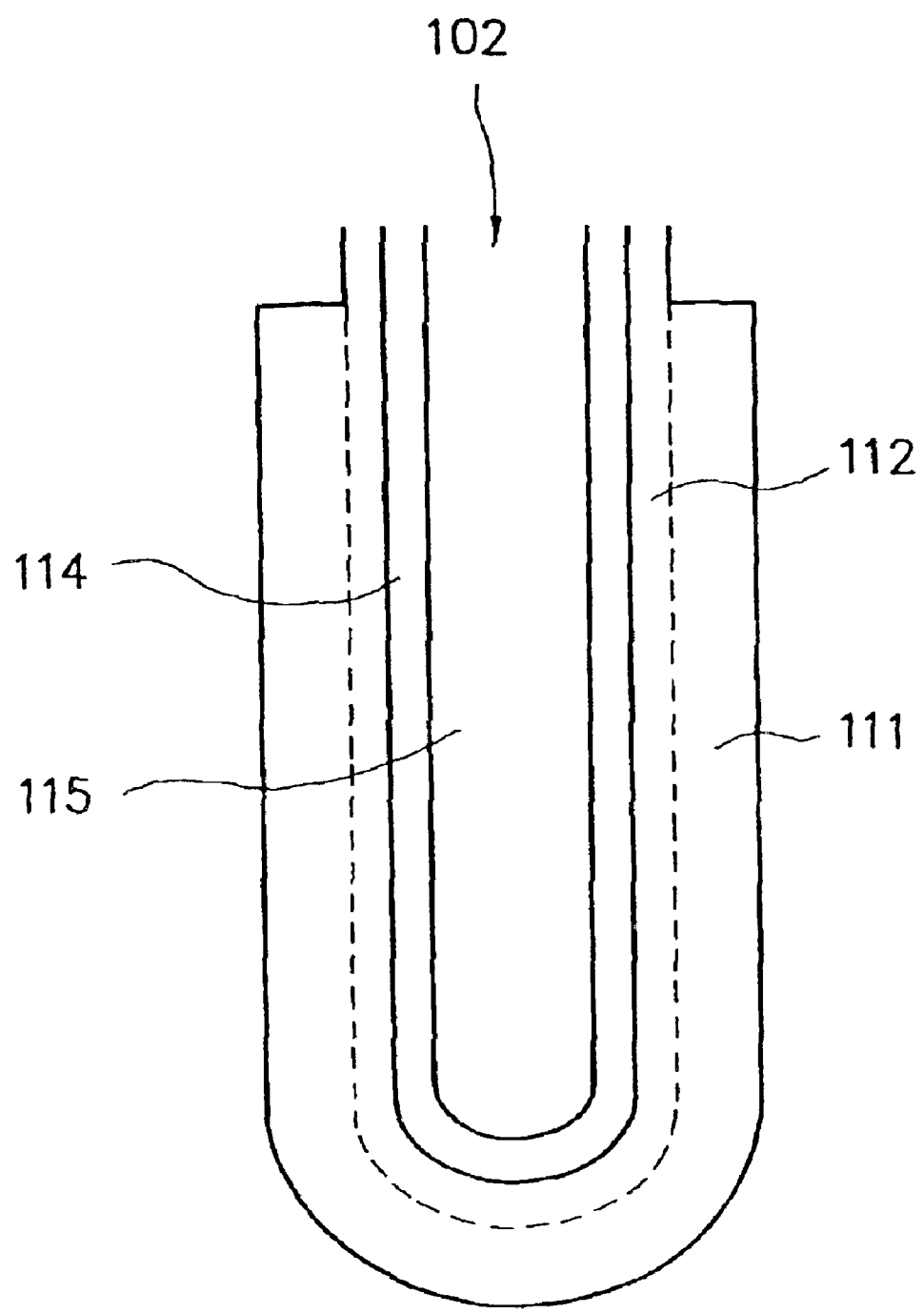

FIG. 2 is a schematic cross-sectional view in a generatrix direction of another preferable example of a high frequency power introduction means according to the present invention.

A cylindrical high frequency power introduction means 102 shaped in a cylindrical form shown in FIG. 2 is a modification of the high frequency power introduction means shown in FIG. 1 such that a metal bar is embedded in the cavity as the isolated region of the high frequency power introduction means shown in FIG. 1.

Particularly, the constitution of the high frequency power introduction means shown in FIG. 2 is the same as that of the high frequency power introduction means shown in FIG. 1, except that a metal bar 115 is disposed in the cavity as the isolated region.

In the high frequency power introduction means 102 shown in FIG. 2, an electrode 112 is formed on an inside face of a cylindrical insulating material 111 such that the electrode 112 is joined with the inside face of the insulating material 111 in a state with no clearance and an isolated region 113 (a cavity) formed inside the electrode 112, wherein the metal bar 115 is arranged in the cavity 113 in a state with a clearance 114 between the electrode 112 and the metal bar 115 as shown in FIG. 2.

Figure 3:
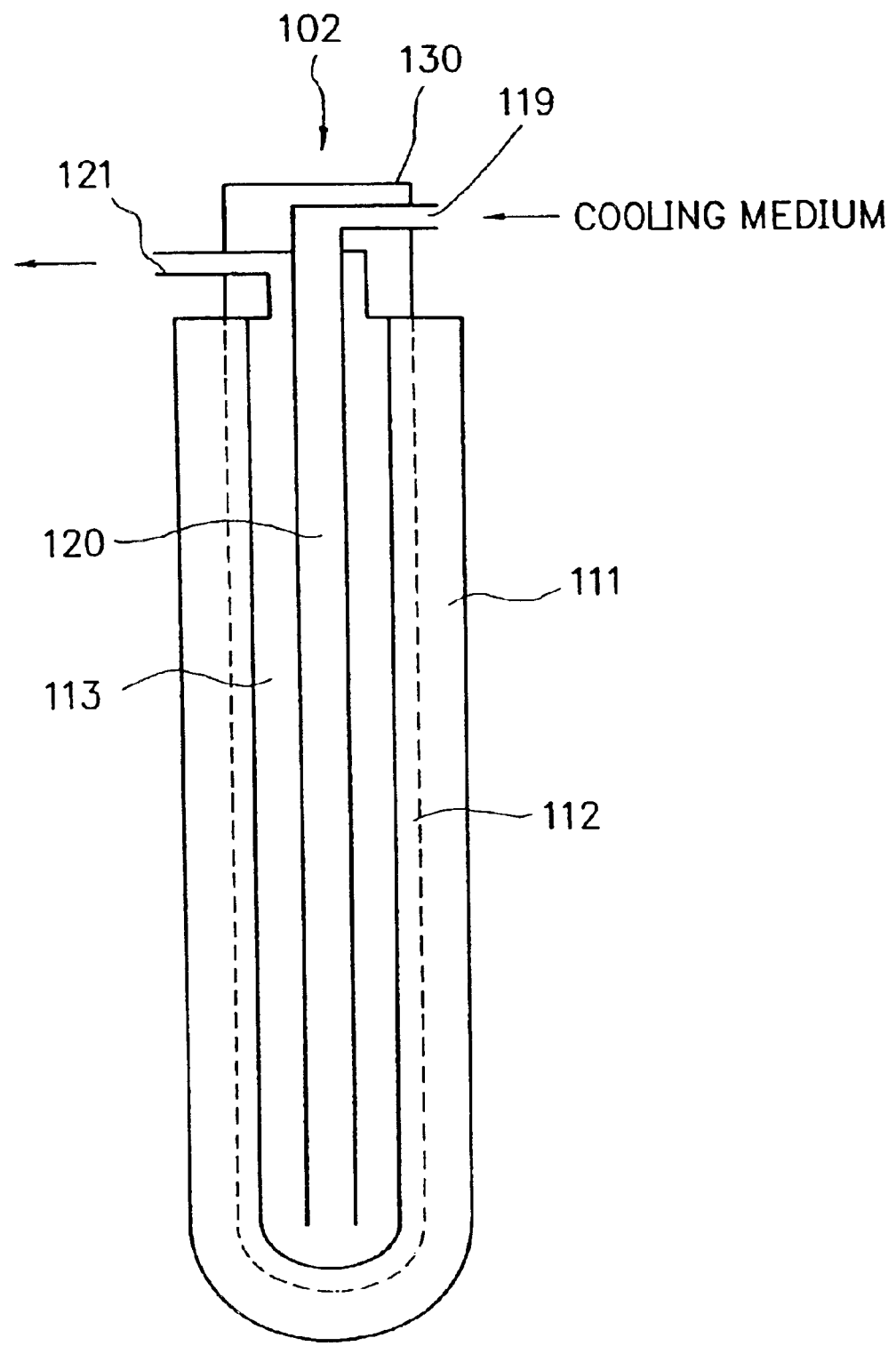

FIG. 3 is a schematic cross-sectional view in a generatrix direction of a further preferable example of a high frequency power introduction means according to the present invention.

A high frequency power introduction means 102 shaped in a cylindrical form shown in FIG. 3 is a modification of the high frequency power introduction means shown in FIG. 1 such that a cooling mechanism is provided in the configuration of the high frequency power introduction means shown in FIG. 1.

In the high frequency power introduction means 102 shown FIG. 3, an electrode 112 is formed on an inside face of a cylindrical insulating material 111 such that the electrode 112 is joined with the inside face of the insulating material 111 in a state with no clearance, and a cavity 113 as an isolated region is formed inside the electrode 112. The cavity 113 is vacuum-sealed by a vacuum-sealing means 130 so as to isolate from the vacuum system of the film-forming space in order to prevent a raw material gas from flowing into the cavity 113.

And the high frequency power introduction means shown in FIG. 3 is provided with a cooling mechanism comprising a cooling medium introduction pipe 120 having a cooling medium inlet port 119 and which is extended through the vacuum-sealing means 130 into the cavity 113 while being open into the cavity 113 and an cooling medium exhaust mechanism with a cooling medium outlet port 121 and which is provided through the vacuum-sealing means 130.

In the high frequency power introduction means shown in FIG. 3, a cooling medium from a cooling medium supply device (not shown) is introduced into the cavity 113 through the inlet port 119 and the introduction pipe 120 to cool the electrode 112 and thereafter, the cooling medium is exhausted to the outside through the outlet port 121 of the exhaust mechanism.

This embodiment is of the case of cooling the high frequency power introduction means by means of the cooling medium. But this is not restrictive. It is possible to heat the high frequency power introduction means by replacing the cooling medium by a heating medium. Besides this, to heat the high frequency power introduction means may be conducted by using a heater disposed in the cavity 113.

Figure 4A:
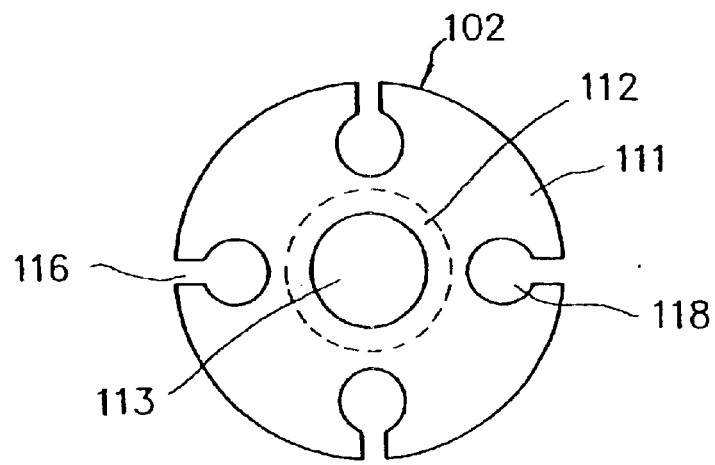
Figure 4B:
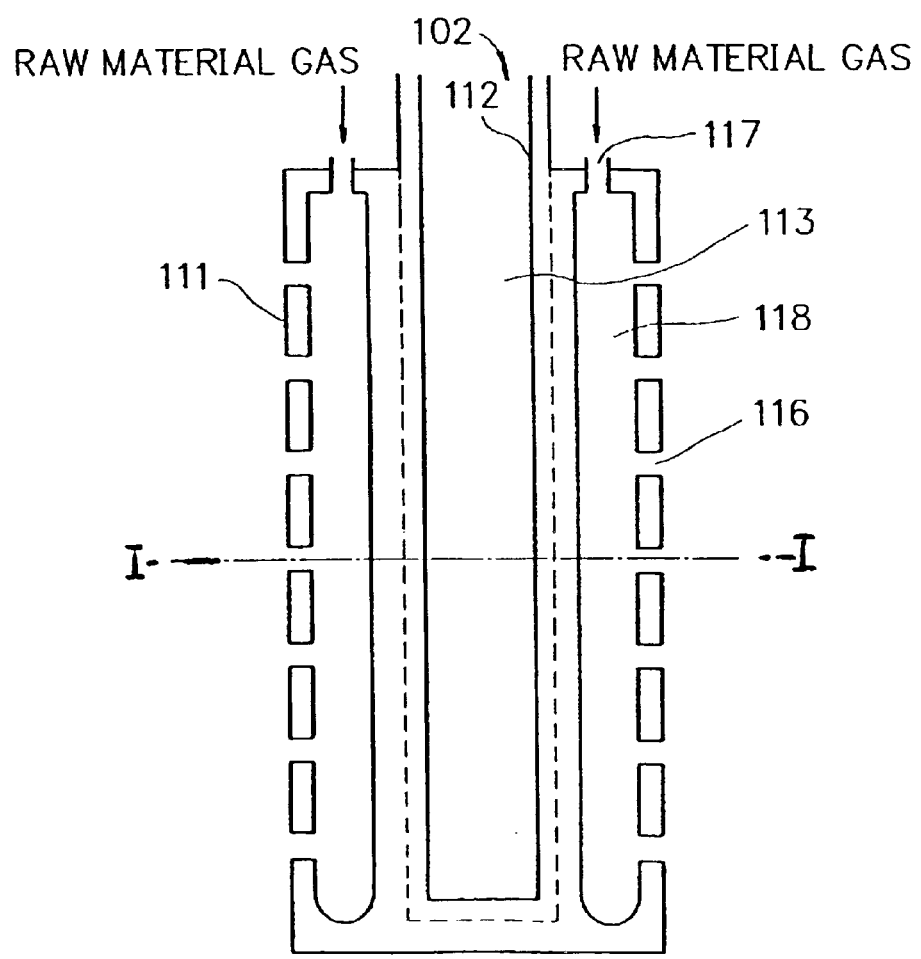

FIGS. 4(a) and 4(b) are schematic cross-sectional views illustrating a preferable of a high frequency power introduction means capable of serving also as a raw material gas introduction means according to the present invention.

FIG. 4(b) is a schematic cross-sectional view in a generatrix direction. FIG. 4(a) is a schematic cross-sectional view, taken along the line I—I in FIG. 4(b).

A high frequency power introduction means 102 shaped in a cylindrical form shown in FIGS. 4(a) and 4(b) is a modification of the high frequency power introduction means shown in FIG. 1 such that a raw material gas introduction mechanism is provided in the configuration of the high frequency power introduction means shown in FIG. 1.

In the high frequency power introduction means shown in FIGS. 4(a) and 4(b), an electrode 112 is formed on an inside face of a cylindrical insulating material 111 such that the electrode 112 is joined with the inside face of the insulating material 111 in a state with no clearance, and a cavity 113 as an isolated region is formed inside the electrode 112. The cavity 113 is vacuum-sealed by a vacuum sealing means (not shown) so as to isolate from the vacuum system of the film-forming space in order to prevent a raw material gas from flowing into the cavity 113.

As well as in the case of the high frequency power introduction means shown in FIG. 1, the upper tip of the electrode 112 is electrically connected through a high frequency power input terminal (not shown) to a high frequency power source provided with a high frequency power transmission circuit (not shown).

The insulating material 111 is provided with a plurality of gas flow pathways 118 formed in the inside thereof. Each of the gas flow pathways 118 has a raw material gas inlet port 117 which is connected to a raw material gas supply system (not shown) containing gas reservoirs (not shown). The insulating material 111 is provided with a plurality of gas release holes 116 at its outer surface on the glow discharge zone side. Each of the gas release holes 116 is formed so as to communicate with one of the gas flow pathways 118.

In the high frequency power introduction means shown in FIGS. 4(a) and 4(b), a raw material gas from the raw material gas supply system is introduced into the gas flow pathways 118 through the raw material gas inlet ports 117 and the raw material gas thus introduced into the gas flow pathways 118 is successively released into the glow discharge zone through the gas release holes 116.

Figure 5:
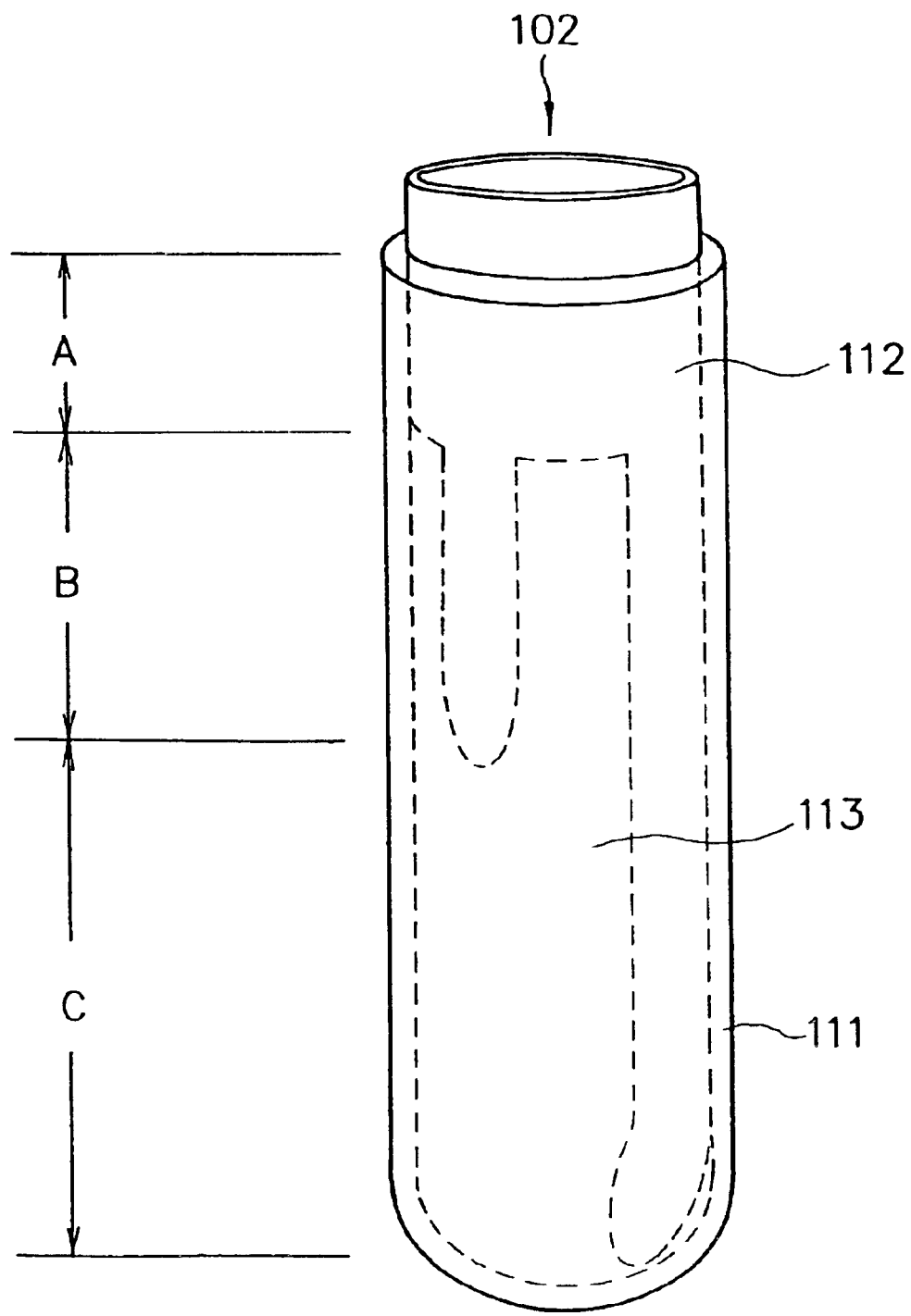
FIG. 5, FIG. 6 and FIG. 7 are schematic perspective views illustrating high frequency power introduction means of the present invention.

FIG. 5 is a schematic slant view illustrating an example of a high frequency power introduction means according to the present invention in which the electrode (the high frequency power propagation path) is partly branched into plural portions so that the impedance is made to be discontinuous.

In FIG. 5, reference numeral 102 indicates a high frequency power introduction means shaped in a cylindrical form which comprises a cylindrical insulating material 111 and an electrode 112 (which is partly branched into plural portions so that the impedance is made to be discontinuous).

A space (with no reference numeral) outside the insulating material 111 is a glow discharge zone (or a discharge space) of a film-forming space (or a reaction chamber).

As apparent from FIG. 5, the electrode 112 is formed on an inside face of the insulating material 111 (that is, on a surface of the insulating material on the side of a region 113 isolated from the glow discharge zone) such that the electrode 112 is joined with the inside face of the insulating material 111 in a state with no clearance.

The region 113 (comprising a cavity) is formed inside the electrode 112 and is isolated from the glow discharge zone. The cavity 113 is vacuum-sealed by a vacuum-sealing means (not shown) so as to isolate from the vacuum system of the film-forming space in order to prevent a raw material gas from flowing into the cavity 113.

The upper tip of the electrode 112 is electrically connected through a high frequency power input terminal (not shown) to a high frequency power source provided with a high frequency power transmission circuit (not shown).

In the high frequency power introduction means shown in FIG. 5, the electrode 112 is configured to have two branched paths inside the insulating material 111 (this corresponds a pattern in which a part of the electrode 112 in FIG. 1 is omitted). The electrode 112 thus configured comprises three regions A, B and C which make the impedance to be discontinuous.

Figure 6:
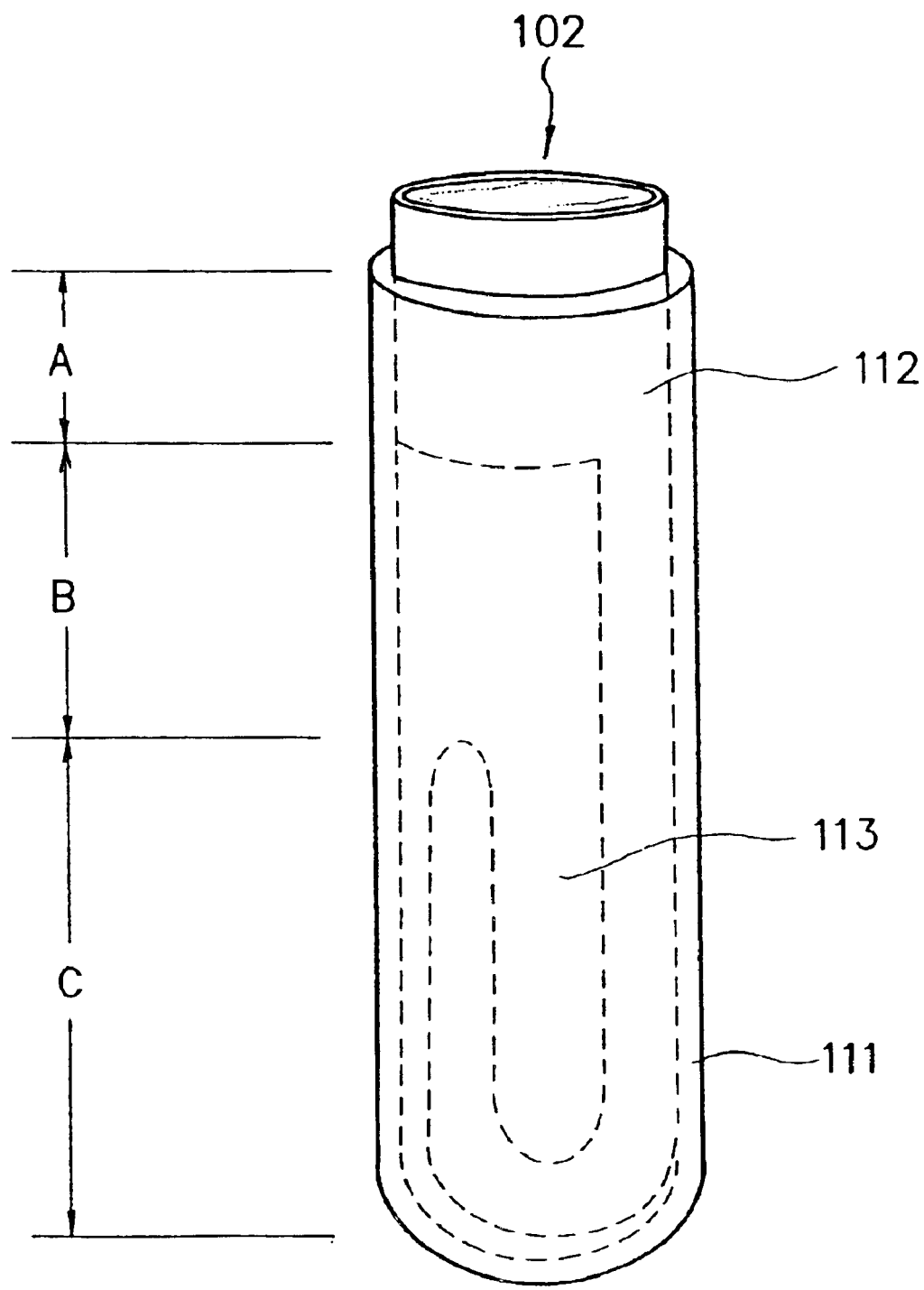

FIG. 6 is a schematic slant view illustrating an example of a high frequency power introduction means according to the present invention in which a part of the electrode 112 (the high frequency power propagation path) is turned up so that the impedance is made to be discontinuous (this corresponds a pattern in which a part of the electrode 112 in FIG. 1 is omitted). The electrode 112 thus configured comprises three regions A, B and C which make the impedance to be discontinuous.

Figure 7:
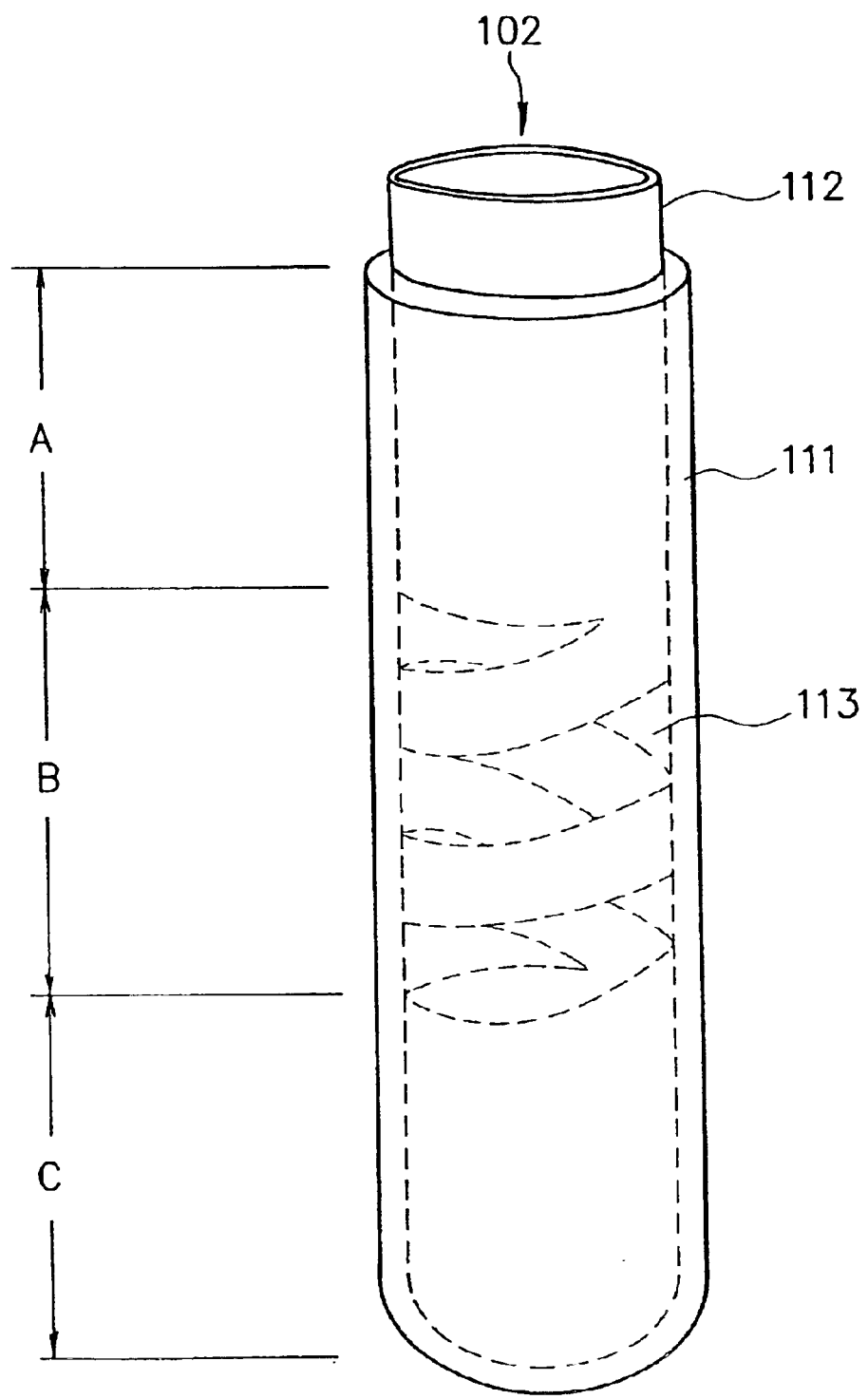

FIG. 7 is a schematic slant view illustrating an example of a high frequency power introduction means according to the present invention in which a part of the electrode 112 (the high frequency power propagation path) is coil-like shaped (or spiraled) so that the impedance is made to be discontinuous. The electrode 112 thus configured comprises three regions A, B and C which make the impedance to be discontinuous.

Figure 8:
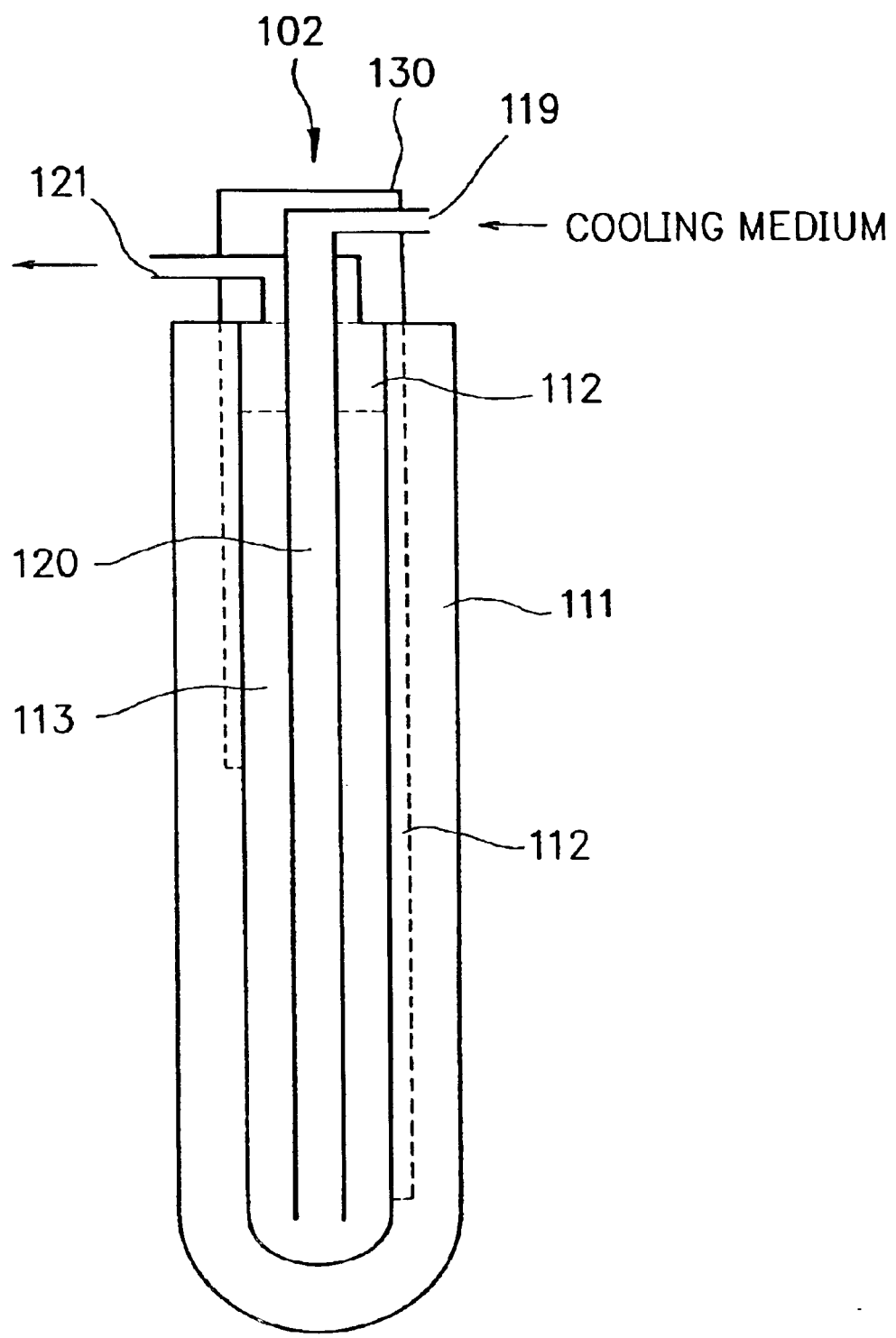

FIG. 8 is a schematic cross-sectional view in a generatrix direction of an example of a high frequency power introduction means provided with a cooling mechanism according to the present invention.

In the high frequency power introduction means 102 shown FIG. 8, an electrode 112 is formed on an inside face of a cylindrical insulating material 111 such that the electrode 112 is joined with the inside face of the insulating material 111 in a state with no clearance, and a cavity 113 as an isolated region is formed inside the electrode 112. The electrode 112 situated inside the insulating material 111 is configured to have two branched paths so that the impedance is made to be discontinuous.

The cavity 113 is vacuum-sealed by a vacuum-sealing means 130 so as to isolate from the vacuum system of the film-forming space in order to prevent a raw material gas from flowing into the cavity 113.

And the high frequency power introduction means shown in FIG. 8 is provided with a cooling mechanism comprising a cooling medium introduction pipe 120 having a cooling medium inlet port 119 and which is extended through the vacuum-sealing means 130 into the cavity 113 while being open into the cavity 113 and an cooling medium exhaust mechanism with a cooling medium outlet port 121 and which is provided through the vacuum-sealing means 130.

In the high frequency power introduction means shown in FIG. 8, a cooling medium from a cooling medium supply device (not shown) is introduced into the cavity 113 through the inlet port 119 and the introduction pipe 120 to cool the electrode 112 and thereafter, the cooling medium is exhausted to the outside through the outlet port 121 of the exhaust mechanism.

This embodiment is of the case of cooling the high frequency power introduction means by means of the cooling medium. But this is not restrictive. It is possible to heat the high frequency power introduction means by replacing the cooling medium by a heating medium. Besides this, to heat the high frequency power introduction means may be conducted by using a heater disposed in the cavity 113.

FIGS. 9(a) and 9(b) are schematic diagrams illustrating an example of a plasma CVD apparatus capable of forming a deposited film on a plurality of substrates at the same time in which a high frequency power introduction means according to the present invention can be used.

The apparatus shown in FIGS. 9(a) and 9(b) comprises a reaction chamber 100, a raw material gas supply system (not shown) containing gas reservoirs (not shown), an exhaust system (not shown) containing a vacuuming device (not shown), and a high frequency power source 107 for supplying a high frequency power to a high frequency power introduction means 102.

The reaction chamber 100 has a structure capable of being vacuumed, and it is provided with an exhaust system containing an exhaust pipe which is open into the reaction chamber and which is connected through a main valve (not shown) to a vacuuming device (not shown).

In the reaction chamber 100, a plurality of rotatable cylindrical substrate holders are spacedly and concentrically arranged so as to circumscribe a glow discharge space 103. Each cylindrical substrate holder is supported by a rotary shaft 108 connected to a driving mechanism including a gear 110 and a driving motor 109. Each cylindrical substrate holder has an electrically conductive substrate 101 in a cylindrical form (on which a deposited film is to be formed) positioned thereon. Each cylindrical substrate holder has a heater 104 installed therein for heating the substrate 101 positioned thereon.

In FIGS. 9(a) and 9(b), there are shown eight cylindrical substrate holders. This is not restrictive. The number of the cylindrical substrate holder to be arranged in the reaction chamber 100 may be optionally changed depending upon the situation, provided that an appropriate glow discharge space circumscribed by the cylindrical substrate holders can be established in the reaction chamber 100. In order to establish such glow discharge space, the number of the cylindrical substrate holder to be arranged in the reaction chamber 100 is desired to be at least four.

The heater 104 installed in each rotatable cylindrical substrate holder may be an appropriate heater which can be hermetically installed in the cylindrical substrate holder. Such heater can include electric insulators such as sheathed heater, plate-like heater, and ceramic heater, heat radiators such as halogen lamp, and heat generators by means of a vapor or liquid heat exchanging medium. Alternatively, these substrate-heating means may be disposed in a substrate-heating vessel provided separately from the reaction chamber 100. In this case, it is possible that the substrates is heated to a desired temperature in the substrate-heating vessel, followed by transferring into the reaction chamber 100 under vacuum condition. Further, it is possible to adopt both the substrate-heating vessel and the heaters 104 installed in the cylindrical substrate holders.

Herein, for the substrate temperature in the film formation in the reaction chamber 100, it should be properly determined depending upon the kind of a deposited film to be formed. However, in general, it is preferably in the range of from 20 to 500° C., more preferably in the range of from 50 to 480° C., most preferably in the range of from 100 to 450° C.

The high frequency power introduction means 102 comprises any of the foregoing high frequency power introduction means according to the present invention and it is positioned at a central position in the discharge space 103 and which is electrically connected to the high frequency power source 107 through a matching box 106.

Reference numeral 105 indicates a raw material introduction means (comprising four gas feed pipes) connected to a raw material gas supply system (not shown) containing gas reservoirs (not shown). For the number of the gas feed pipe in the raw material gas introduction means 105, it may be one. However, it is desired to be a number corresponding to about ½ of the number of the cylindrical substrates used.

In the case where a high frequency power introduction means of the configuration shown in FIG. 4 which can serves also as a raw material gas introduction means is used as the high frequency power introduction means 102, the raw material gas introduction means 105 can be omitted because said high frequency power introduction means serves also as the raw material gas introduction means. In this case, a plurality of high frequency power introduction means of the configuration shown in FIG. 4 may be spacedly arranged on a circumference concentric to the arrangement circle of the cylindrical substrates 101 as previously described.

In FIGS. 9(a) and 9(b), there is shown only one high frequency power introduction means. This is not restrictive. The number of the high frequency power introduction means used in the reaction chamber may be plural depending upon the situation.

The matching box 106 may take any constitution as long as it can adequately match the high frequency power source 107 and a load occurred. In this case, it is desired to be made so that the matching can be automatically conducted. Alternatively, it is possible to be made such that the matching is conducted in a manual manner.

The cylindrical substrate holder may be constituted by an electrically conductive material selected from the group constituting of Cu, Al, Au, Ag, Pt, Pb, Ni, Co, Fe, Cr, Mo, Ti, stainless steel, and composite materials of these.

For the substrate 101 positioned on each cylindrical substrate holder, to use a electrically conductive substrate shaped in a cylindrical form as shown FIGS. 9(a) and 9(b) is suitable particularly in the production of an electrophotographic light receiving member. But it may be shaped in other appropriate form such as a plate-like form depending upon the kind of a device to be produced.

The substrate 101 may be a substrate shaped in a cylindrical form or other desired form made of an a metal selected from the group consisting of Al, Cr, No, Au, In, Nb, Ni, Te, V, Ti, Pt, Pb and Fe; an alloy selected from the group of alloys of these metals such as stainless steel; or a material selected from the group consisting of composite materials of these.

Alternatively, the substrate 101 may comprise an insulating member having a surface coated by an electrically conductive material on which a deposited film is to be formed. The insulating member in this case can include alumina ceramics, aluminum nitride, boron nitride, silicon nitride, silicon carbide, beryllium oxide, quartz glass, and pyrex glass, and besides these, synthetic resins such as polycarbonate, polyamide, polyimide, and Teflon (trademark name). In this case, the remaining surface of the insulating member is desired to be also coated by an electrically conductive material.

The production of a light receiving member according to the present invention using the plasma CVD apparatus shown in FIGS. 9(a) and 9(b) may be conducted, for example, in the following manner.

A well-cleaned cylindrical substrate 101 having a polished surface is positioned on each cylindrical substrate holder in the reaction chamber 100. The inside of the reaction chamber 100 is evacuated to a desired high vacuum degree through the exhaust pipe by operating the vacuuming device (not shown).

Thereafter, the substrates 101 positioned on the cylindrical substrate holders are heated to a desired temperature by means of the heaters 104 while rotating the cylindrical substrate holders. When the temperature of each substrate becomes stable at this temperature, a raw material gas from the raw material gas supply system (not shown) is introduced into the reaction chamber 100 through the raw material gas introduction means 105. In this case, a due care should be made so that neither sudden gas release nor sudden gas pressure change are occurred. when the flow rate of the raw material introduced into the reaction chamber 100 becomes stable at a desired value, the main valve of the exhaust system (not shown) is controlled while observing the reading on a vacuum gage (not shown) provided in the exhaust system to establish a desired gas pressure (or a desired inner pressure) in the reaction chamber 100.

When the inner pressure in the reaction chamber 100 becomes stable, the power source 107 is switched on to apply a high frequency power (with a desired oscillation frequency) of a desired wattage to the high frequency power introduction means 102 through the matching box 106 to cause glow discharge in the discharge space 103 of the reaction chamber 100. In this case, a matching circuit (not shown) contained in the matching box 106 is properly adjusted so that a reflected wave is minimized. By this glow discharge caused, the raw material gas introduced into the reaction chamber 100 is decomposed to cause the formation of a deposited film on each substrate 101. In this case, by rotating each substrate 101 during the film formation by means of the driving motor 109, the film is uniformly deposited over the entire surface of the substrate.

After completing the film formation, the power source is switched off, and the introduction of the raw material gas into the reaction chamber 100 is terminated. Then, the inside of the reaction chamber 100 is evacuated to a desired vacuum degree in the same manner as above described.

In the case where a multi-layered deposited film is intended to form, the above film-forming procedures are repeated. By this, there can be formed a multi-layered deposited film on each substrate.

For the inner pressure (or the gas pressure) in the reaction chamber 100 upon the film formation, it should be properly determined depending upon the kind of a deposited film to be formed. However, in general, it is preferably in the range of from 0.01 to 1000 Pa, more preferably in the range of from 0.03 to 300 Pa, most preferably in the range of from 0.1 to 100 Pa.

For the raw material gas used, for instance, in the case of forming an amorphous silicon (a-Si) deposited film, there can be used, for example, gaseous or easily gasifiable silicon hydrides (silanes) such as $SiH_4$, $Si_2H_6$, and the like as a Si-supplying raw material gas.

Besides these, there can be used fluorine-containing silicon compounds such as gaseous or easily gasifiable fluorine-substituted silane derivatives as a Si-supplying raw material gas. Specific examples of such fluorine substituted silane derivative are silicon fluorides such as $SiF_4$, $Si_2F_6$ and the like, fluorine-substituted silicon hydrides such as $SiH_3F$, $SiH_2F_2$, $SiHF_3$, and the like.

If necessary, these Si-supplying raw material gases can be used by diluting with an appropriate dilution gas such as $H_2$ gas, He gas, Ar gas, or Ne gas.

Further, it is possible to use a doping gas capable supplying an atom belonging to group III of the periodic table such as B, Ga, or In or an atom belonging to group V of the periodic table such as P, As, or Sb together with the foregoing Si-supplying raw material gas. Specifically, in the case of using B as a dopant, the doping gas capable of supplying B can include boron hydrides such as $B_2H_6$ and $B_4H_{10}$ and boron halides such as $BF_3$ and $BCl_3$. In the case of using P as a dopant, the doping gas capable of supplying P can include phosphorous hydrides such as $PH_3$ and $P_2H_4$.

Separately, for instance, in the case of forming an amorphous silicon carbide (a-SiC) deposited film, in addition to the foregoing Si-supplying raw material gas, an appropriate C-supplying raw material gas used. Such C-supplying raw material gas can include gaseous or easily gasifiable compounds containing carbon atoms (C) and hydrogen atoms (H) as the constituent atoms such as saturated hydrocarbons of 1 to 5 carbon atoms, ethylene series hydrocarbons of 2 to 4 carbon atoms, and acetylene series hydrocarbons of 2 to 3 carbon atoms. Specific examples of the saturated hydrocarbon are methane ($CH_4$) and ethane ($C_2H_6$). Specific examples of the ethylene series hydrocarbon are ethylene ($C_2H_4$) and propylene ($C_3H_6$). Specific examples of the acetylene series hydrocarbon are acetylene ($C_2H_2$) and methyl acetylene ($C_3H_4$).

For instance, in the case of forming an amorphous silicon oxide (a-SiO) deposited film, in addition to the foregoing Si-supplying raw material gas, an appropriate gaseous or easily gasifiable O-supplying raw material gas used. Such O-supplying raw material gas can include oxygen ($O_2$), ozone ($O_3$), nitrogen monoxide (NO), nitrogen dioxide ($NO_2$), dinitogen oxide ($N_2O$), dinitogen trioxide ($N_2O_3$), dinitrogen tetraoxide ($N_2O_4$), dinitrogen pentoxide ($N_2O_5$), nitrogen trioxide ($NO_3$), and lower siloxanes comprising silicon atoms (Si), oxygen atoms (O) and hydrogen atoms (H) as the constituent atoms such as disiloxane ($H_3SiOSiH_3$) and trisiloxane ($H_3SiOSiH_2OSiH_3$).

For instance, in the case of forming an amorphous silicon nitride (a-SiN) deposited film, in addition to the foregoing Si-supplying raw material gas, an appropriate gaseous or easily gasifiable N-supplying raw material gas used. Such N-supplying raw material gas can include nitrogen and nitrogen compounds such as nitrides and azide compounds. Specific examples are nitrogen ($N_2$), ammonia ($NH_3$), hydrazine ($H_2NNH_2$), hydrogen azide ($HN_3$) and ammonium azide ($NH_4N_3$). Besides these, nitrogen halide compounds such as nitrogen trifluoride ($F_3N$) and nitrogen tetrafluoride ($F_4N_2$) can be used. These can also introduce halogen atoms (X) in addition to the introduction of nitrogen atoms (N).

Figure 22A:
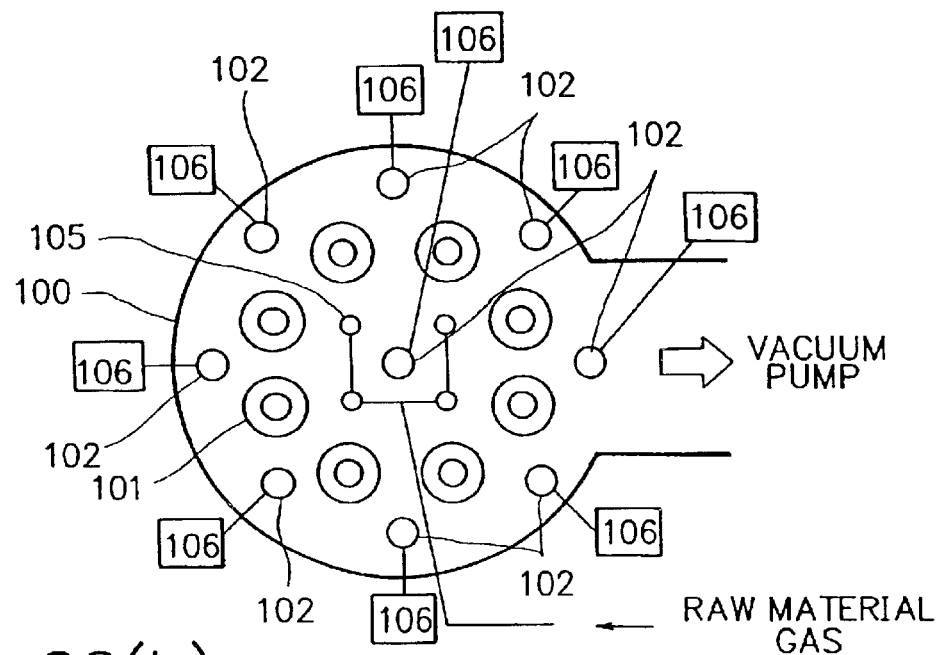
Figure 22B:
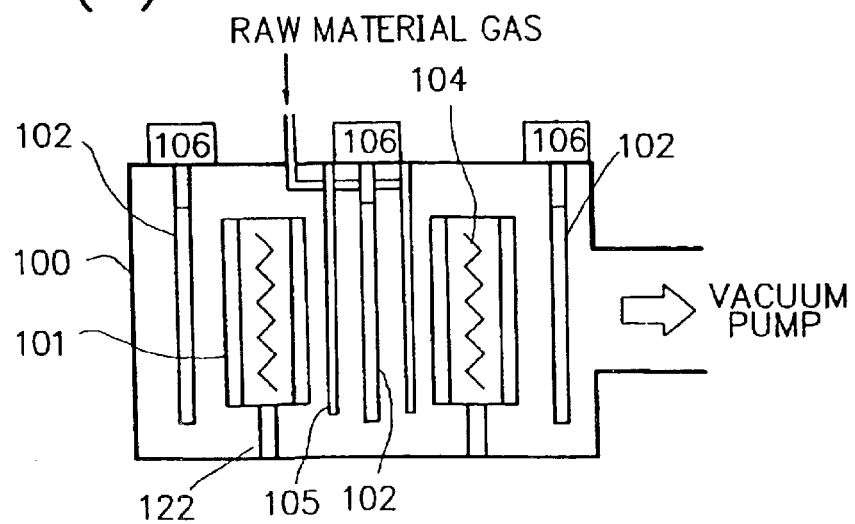

FIGS. 22(a) and 22(b) are schematic diagrams illustrating another example of a plasma CVD apparatus capable of forming a deposited film on a plurality of substrates at the same time in which a high frequency power introduction means according to the present invention can be used.

The plasma CVD apparatus shown in FIGS. 22(a) and 22(b) comprises a modification of the plasma CVD apparatus shown in FIGS. 9(a) and 9(b), in which in addition to the high frequency power introduction means 102 positioned at the central position of the discharge space in the plasma CVD apparatus shown in FIGS. 9(a) and 9(b), eight high frequency power introduction means 102 (according to the present invention) are installed such that they are spacedly arranged on a circumference concentric to the arrangement circle of the eight cylindrical substrate holders at a position outside the arrangement circle of the eight cylindrical substrate holders, and each cylindrical substrate holder having an electrically conductive substrate 101 positioned thereon is supported by a shaft 122 with no driving mechanism. In the apparatus shown in FIGS. 22(a) and 22(b), each high frequency power introduction means 102 is electrically connected to a high frequency power source (not shown) through a matching box 106.

In the apparatus shown in FIGS. 22(a) and 22(b), glow discharge is uniformly generated inside and outside the arrangement circle of the eight cylindrical substrate holders and because of this, it is not necessary for the substrates 101 positioned on the cylindrical substrate holders to be rotated upon the film formation. But, if necessary, they may be rotated as in the case of the apparatus shown in FIGS. 9(a) and 9(b).

The film formation using the apparatus shown in FIGS. 22(a) and 22(b) may be conducted in the same manner as in the case of the apparatus shown in FIGS. 9(a) and 9(b).

In the following, the present invention will be described in more detail with reference to experiments and examples. It should be understood that the scope of the present invention is not limited by these experiments and examples.

For a case where no description is made for the joining between the insulating material and the electrode in the following experiments and examples belonging to the present invention, it means that the joining was conducted by way of chemical plating. It should be understood that the joining between the insulating material and the electrode in the present invention may be conducted by may of other joining manner such as thermal spraying, sputtering, brazing, solid diffusion welding, plasma CVD or vacuum evaporation.

Experiment 1

In this experiment, as the high frequency power introduction means 102 in the plasma CVD apparatus shown in FIGS. 9(a) and 9(b), there was used the high frequency power introduction means shown in FIG. 1 having a length of 420 mm according to the present invention. Distribution state of a plasma generated upon glow discharge in this apparatus was examined by measuring a saturated electron current by means of a Langmuir probe. The Langmuir probe was set to the apparatus so that it can be moved under vacuum condition in the reaction chamber 100. The measurement of the saturated electron current was conducted for every 20 mm length in the generatrix direction of the high frequency power introduction means 102. Glow discharge was conducted under conditions shown in Table 1.

Figure 10:
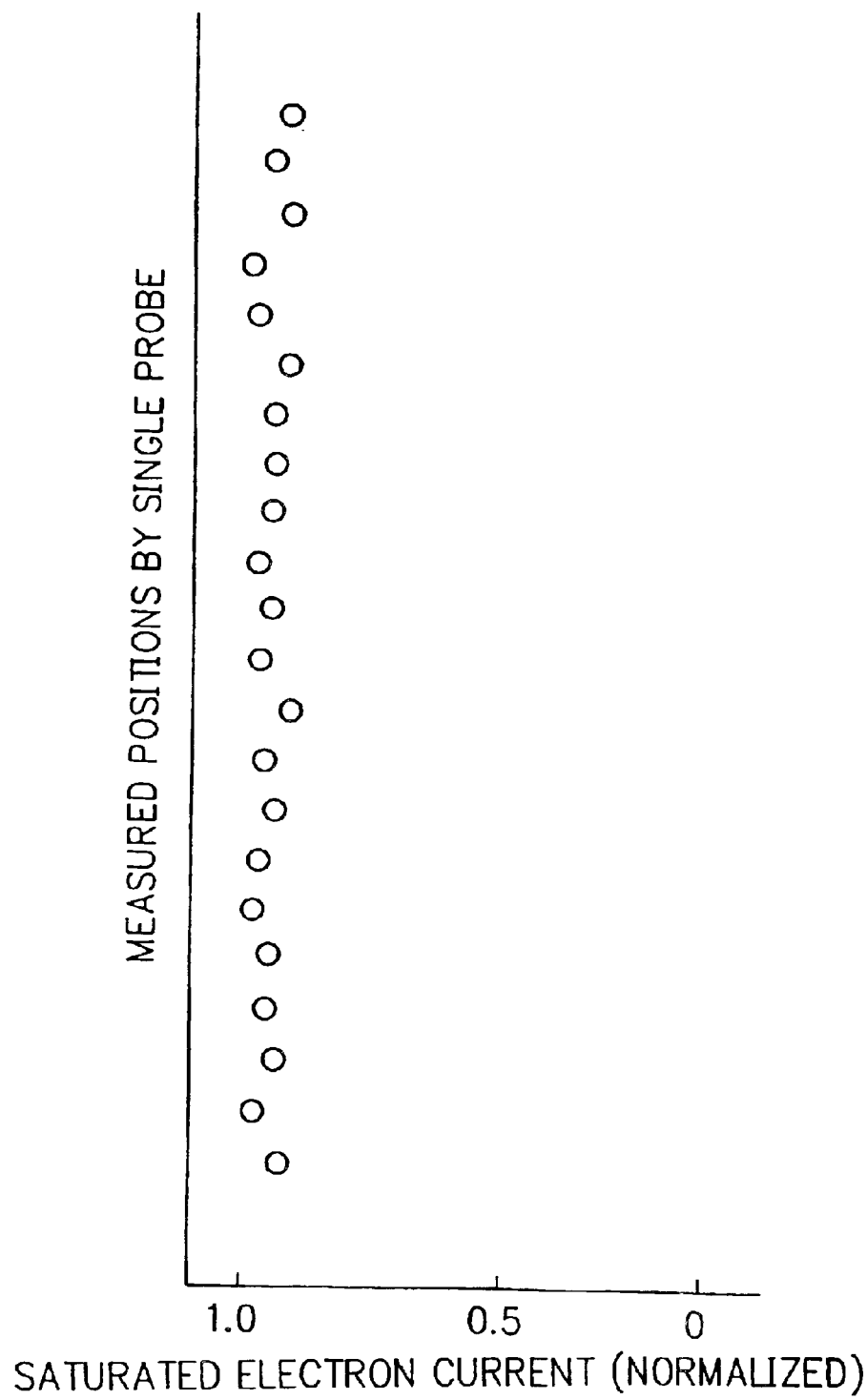
FIG. 10, FIG. 11, FIG. 16, FIG. 17, FIG. 18 and FIG. 19 are graphs showing a saturated electron current distribution.

The measured saturated electron currents are graphically shown in FIG. 10. In FIG. 10, the largest saturated electron current is normalized to be 1.

From FIG. 10, the high frequency power introduction means is understood to be substantially uniform for plasmas generated in the glow discharge.

Comparative Experiment 1

In this comparative experiment, as the high frequency power introduction means 102 in the plasma CVD apparatus shown in FIGS. 9(a) and 9(b), there was used a conventional high frequency power introduction means similar to the high frequency power introduction means shown in FIG. 1 in terms of the structure but comprising a solid metal electrode with a ceramic cover and having a clearance of about 1 mm between the solid metal electrode and the ceramic cover. The clearance herein is of a value in the apparatus designing but does not mean that the actual clearance between the solid metal electrode and the ceramic cover is uniform at about 1 mm.

Distribution state of a plasma generated upon glow discharge in this apparatus was examined in the same manner as in Experiment 1.

Figure 11:
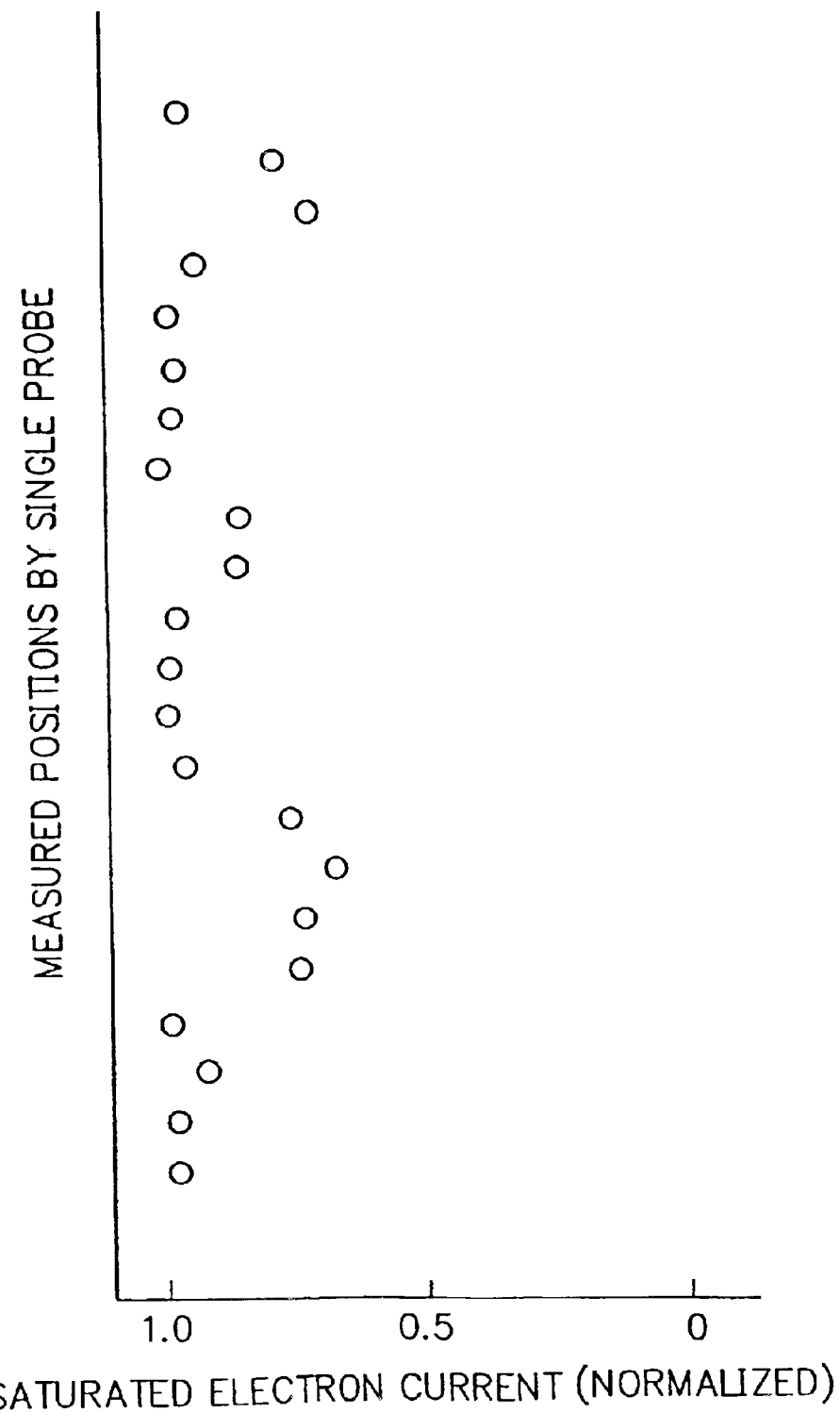

The measured saturated electron currents are graphically shown in FIG. 11. In FIG. 11, the largest saturated electron current is normalized to be 1.

From FIG. 11, the conventional high frequency power introduction means is understood to be apparently uneven for plasmas generated in the glow discharge.

Experiment 2 and Comparative Experiment 2

Experiment 2

In this experiment, as the high frequency power introduction means 102 in the plasma CVD apparatus shown in FIGS. 9(a) and 9(b), there was used the high frequency power introduction means shown in FIG. 1 having a length of 420 mm according to the present invention. Distribution state of a plasma generated upon glow discharge in this apparatus was examined by measuring a saturated electron current by means of a Langmuir probe. In addition, deposition rate for a film deposited was also measured by means of the Langmuir probe. The Langmuir probe was set to the apparatus so that it can be moved under vacuum condition in the reaction chamber 100. The measurement of the saturated electron current was conducted for every 20 mm length in the generatrix direction of the high frequency power introduction means 102. Glow discharge was conducted under conditions shown in Table 2.

Comparative Experiment 2

In this comparative experiment, as the high frequency power introduction means 102 in the plasma CVD apparatus shown in FIGS. 9(a) and 9(b), there were used a plurality of conventional high frequency power introduction means similar to the high frequency power introduction means shown in FIG. 1 in terms of the structure but each comprising a solid metal electrode with a ceramic cover and having a different clearance in the range of from about 0.2 mm to 20 mm between the solid metal electrode and the ceramic cover. The clearance herein is of a value in the apparatus designing but does not mean that the actual clearance between the solid metal electrode and the ceramic cover is uniform at said value.

Distribution state of a plasma generated upon glow discharge and deposition rate for a film deposited were examined in the same manner as in Experiment 2.

Evaluation

Figure 12:
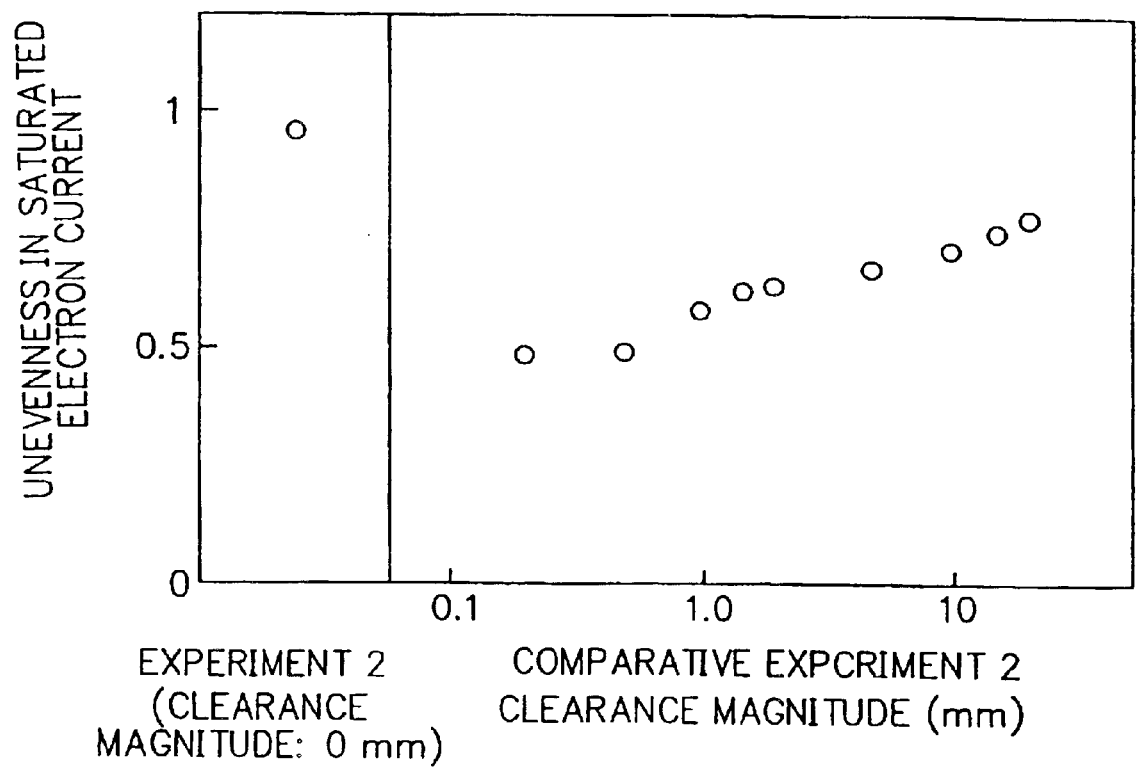
FIG. 12 is a graph showing unevenness in saturated electronic current.

The measured saturated electron currents in Experiment 2 and Comparative Experiment 2 are graphically shown in FIG. 12. Each of the values shown in FIG. 12 is a ratio of the smallest saturated electron current to the largest saturated electron current (the case wherein no unevenness was observed is 1). The measured deposition rates in Experiment 2 and Comparative Experiment 2 are graphically shown in FIG. 13. The deposition rates shown in FIG. 13 are values relative to the deposition rate obtained in the case of 0.2 mm in the foregoing clearance, which is set at 1.

Figure 13:
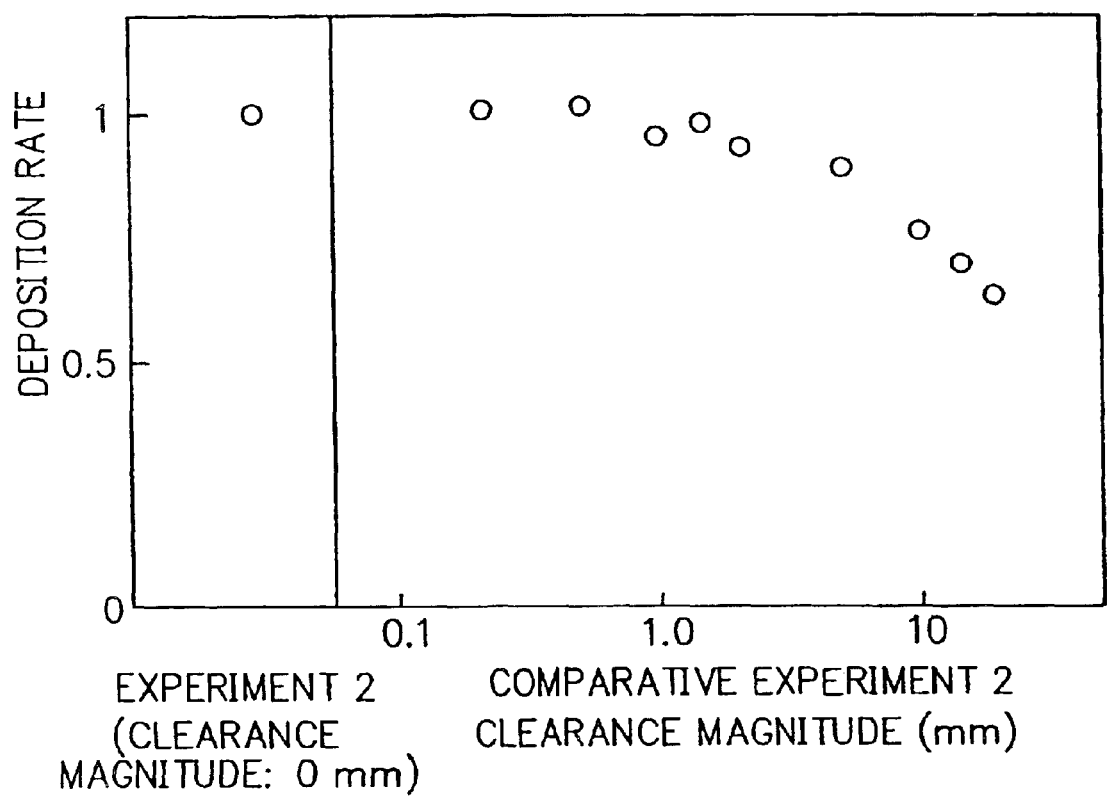
FIG. 13 is a graph showing deposition rate.

Based on the results shown in FIGS. 12 and 13, the following facts are understood. In the case of using the conventional high frequency power introduction means having a clearance between the electrode and the cover, there is occurred a distinguishable unevenness in a saturated electron current distribution. The occurrent of this unevenness is liable to relax as the magnitude of the clearance is enlarged. However, there is still occurred an undesirable unevenness in a saturated electron current distribution when the magnitude of the clearance is 20 mm.

For the deposition rate in the case of using the conventional high frequency power introduction means, it has a tendency of decreasing as the magnitude of the clearance is increased. This tendency is significant when the magnitude of the clearance is more than 10 mm. The reason for this is considered such that the loss in the high frequency power is increased as the magnitude of the clearance is increased and particularly, said loss is markedly increased when the magnitude of the clearance is more than 10 mm.

Experiment 3 and Comparative Experiments 3 and 4

Experiment 3

Figure 14:
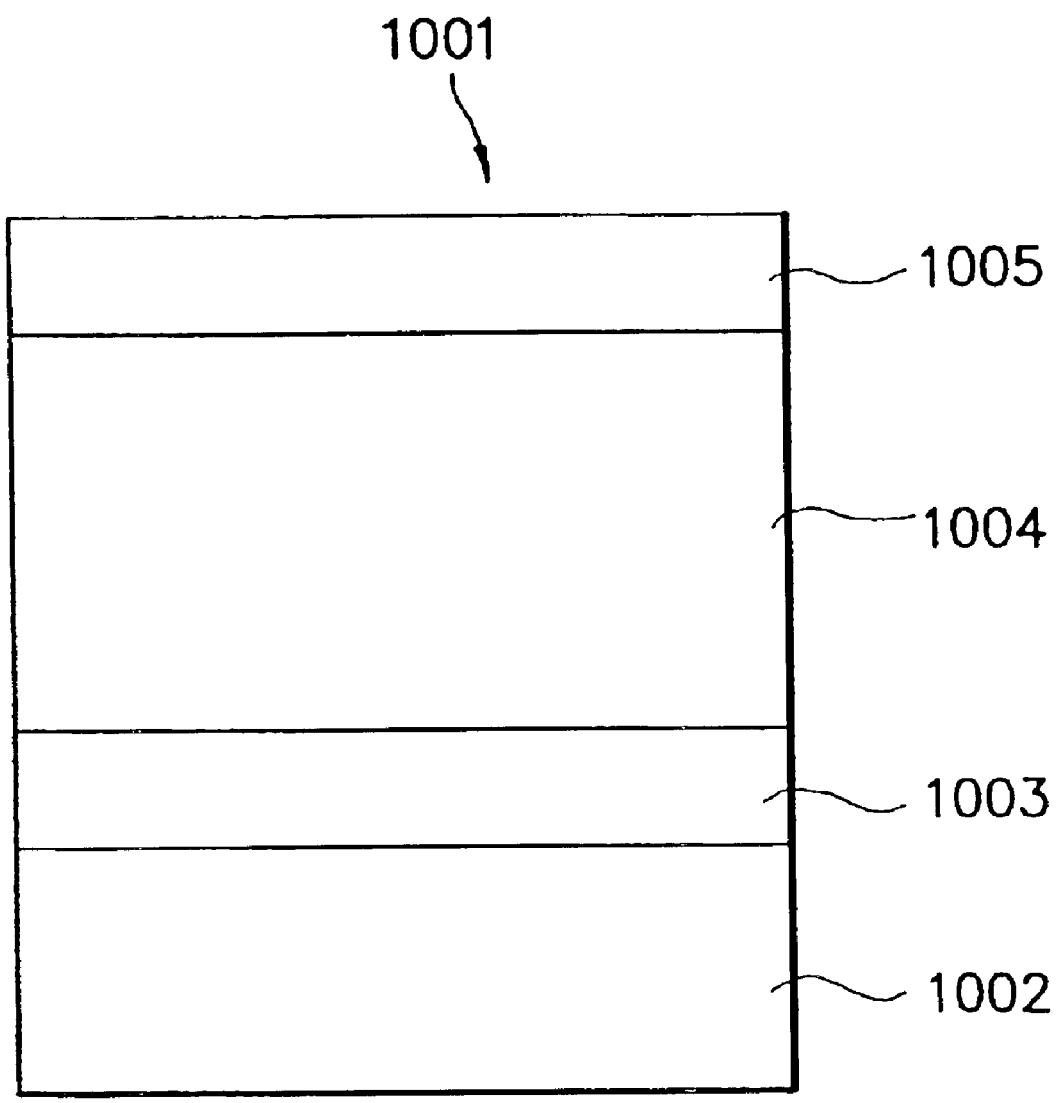
FIG. 14 and FIG. 20 are schematic cross-sectional views illustrating a light receiving member produced according to the present invention.

In this experiment, there were prepared eight light receiving members of the configuration shown in FIG. 14. In FIG. 14, reference numeral 1001 indicates a light receiving member comprising a charge injection inhibition layer 1003, a photoconductive layer 1004 and a surface layer 1005 stacked in the named order on a substrate 1002.

Particularly, using the plasma CVD apparatus shown in FIGS. 9(a) and 9(b) having the high frequency power introduction means shown in FIG. 1 according to the present invention, there were prepared said eight light receiving members in accordance with the previously described film-forming procedures using the plasma CVD apparatus shown in FIGS. 9(a) and 9(b) and under film-forming conditions shown in Table 3. It should be noted that the thicknesses mentioned in Table 3 are rough values.

Herein, the charge injection inhibition layer is composed of an amorphous material containing silicon atoms (Si) as a matrix, hydrogen atoms (H) and boron atoms (B), the photoconductive layer is composed of an amorphous material containing silicon atoms (Si) as a matrix, hydrogen atoms (H) and boron atoms (B), and the surface layer is composed of an amorphous material containing silicon atoms (Si), carbon atoms (C) and hydrogen atoms (H).

In this experiment, as the high frequency power introduction means, there were used a plurality of high frequency power introduction means of the configuration shown in FIG. 1 each comprising an electrode 112 having an alumina ceramic material as an insulating material 111 plasma-sprayed on the surface of the electrode in which the insulating material 111 has a sandblasted uneven surface (on the glow discharge zone side) of a different surface roughness in the range of from about 1 $\mu$m to about 300 $\mu$m in terms of JIS ten-point average roughness (RZ). And the above information for the preparation of the eight light receiving members was conducted for each of these high frequency power introduction means.

For the eight light receiving members obtained in each lot, their surfaces were observed using an optical microscope, wherein the number of a spherical growth defect of more than 10 $\mu$m in diameter present per 10 $cm_2$ was examined. And there was obtained a mean value among the spherical growth defect numbers of the eight light receiving members.

Comparative Experiment 3

The procedures of Experiment 3 were repeated, except that the plurality of high frequency power introduction means used in Experiment 3 were replaced by a plurality of conventional high frequency power introduction means each comprising a metal electrode having an alumina ceramic material plasma-sprayed on the surface of the electrode in which the insulating material has a sandblasted uneven surface (on the glow discharge zone side) of a different surface roughness in the range of from about 1 μm to about 300 μm in terms of JIS ten-point average roughness (RZ), to thereby obtained eight light receiving members for each high frequency power introduction means.

For the eight light receiving members obtained in each lot, their surfaces were observed using an optical microscope, wherein the number of a spherical growth defect of more than 10 μm in diameter present per 10 $cm_2$ was examined. And there was obtained a mean value among the spherical growth defect numbers of the eight light receiving members.

Comparative Experiment 4

The procedures of Experiment 3 were repeated, except that the plurality of high frequency power introduction means used in Experiment 3 were replaced by a plurality of conventional high frequency power introduction means each comprising only a metal electrode having no insulating material cover in which the metal electrode has a sand-blasted uneven surface (on the glow discharge zone side) of a different surface roughness in the range of from about 1 μm to about 300 μm in terms of JIS ten-point average roughness (RZ), to thereby obtained eight light receiving members for each high frequency power introduction means.

For the eight light receiving members obtained in each lot, their surfaces were observed using an optical microscope, wherein the number of a spherical growth defect of more than 10 μm in diameter present per 10 $cm_2$ was examined. And there was obtained a mean value among the spherical growth defect numbers of the eight light receiving members.

Evaluation

Figure 15:
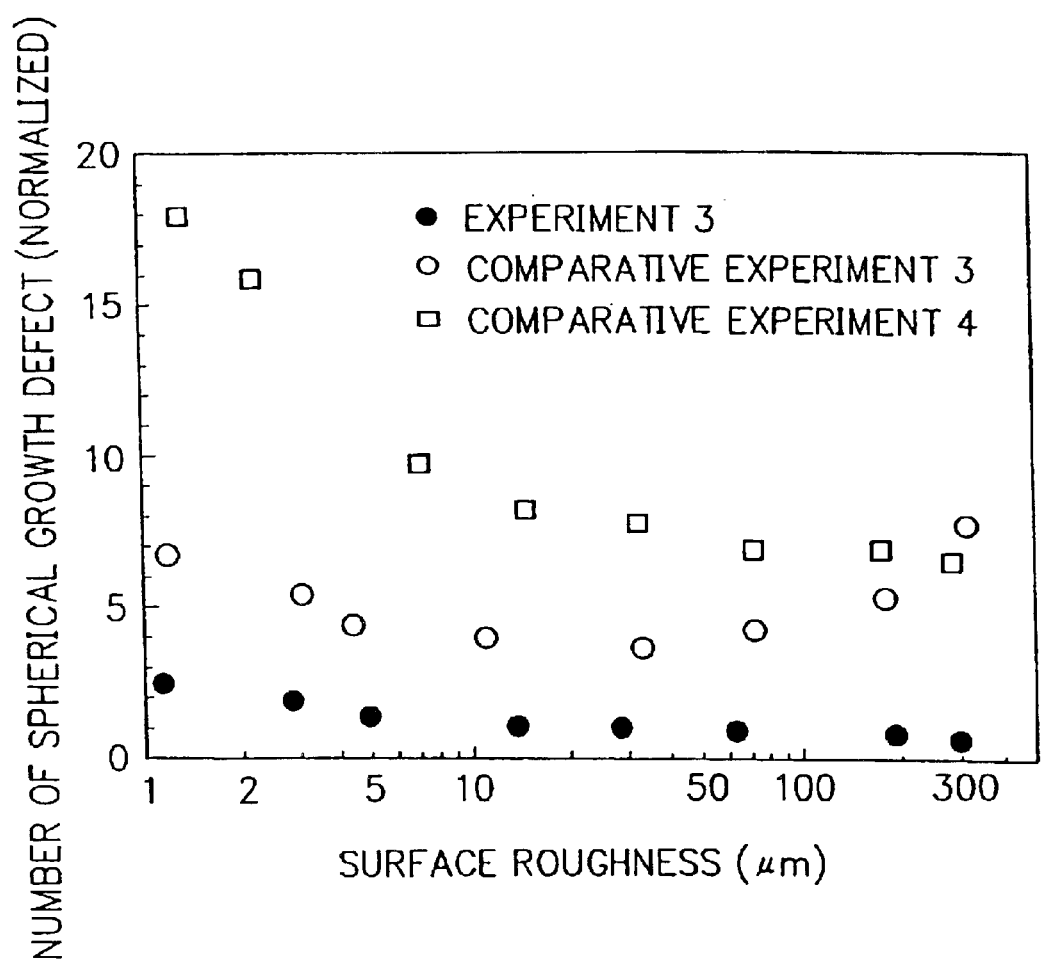

The results obtained in Experiment 3 and Comparative Experiments 3 and 4 are graphically shown in FIG. 15. The spherical growth defect values in FIG. 15 are values relative to the spherical growth defect value obtained in the case of about 30 μm in surface roughness in Experiment 3, which is set at 1.

Based on the results shown in FIG. 15, the following facts are understood.

In the case of using a high frequency power introduction means having a roughened surface, there is a tendency in that layer peeling is prevented from occurring and the occurrence of a spherical growth defect is diminished. Especially, as apparent from the results obtained Experiment 3, the use of any of the high frequency power introduction means having a surface with such surface roughness as above described according to the present invention provides a significant effect of markedly preventing the occurrence of a spherical growth defect. However, it is relatively difficult to efficiently attain a surface roughness of beyond 200 μm. Therefore, for the practically attainable surface roughness, a preferable range is 200 μm or less, and a more preferable range is from 5 μm to 200 μm.

For the high frequency power introduction means (an alumina ceramic material was simply plasma-sprayed) used in Comparative Experiment 3, the surface of each of their plasma-sprayed bodies was observed. As a result, there was found a ruin where a part of the plasma-sprayed body had been removed for all the high frequency power introduction means. In addition, there was found that the magnitude for this removal tends to increase as the surface roughness is increased. It is considered that the results obtained in Comparative Experiment 3 shown in FIG. 15 indicate that the adhesion of a film deposited on the surface of the high frequency power introduction means is improved by increasing the surface roughness where the prevention of the occurrence of a spherical growth defect is expected to improve accordingly, but an influence due to the removal of the plasma-sprayed body gradually becomes significant where the occurrence of a spherical growth defect tends to increase from a certain surface roughness.

Even for such high frequency power introduction means used in Comparative Experiment 4, the situation of preventing the occurrence of a spherical growth defect is improved by increasing the surface roughness. But the effect is apparently inferior to that in the case of using the high frequency power introduction means according to the present invention.

Experiment 4

In this experiment, as the high frequency power introduction means 102 in the plasma CVD apparatus shown in FIGS. 9(a) and 9(b), there was used the high frequency power introduction means shown in FIG. 5 (in which the insulating material 111 comprises an alumina ceramic material) having a length of 420 mm according to the present invention. Distribution state of a plasma generated upon glow discharge in this apparatus was examined by measuring a saturated electron current by means of a Langmuir probe. The Langmuir probe was set to the apparatus so that it can be moved under vacuum condition in the reaction chamber 100. The measurement of the saturated electron current was conducted for every 20 mm length in the generatrix direction of the high frequency power introduction means 102. Glow discharge was conducted under conditions shown in Table 4.

Figure 16:
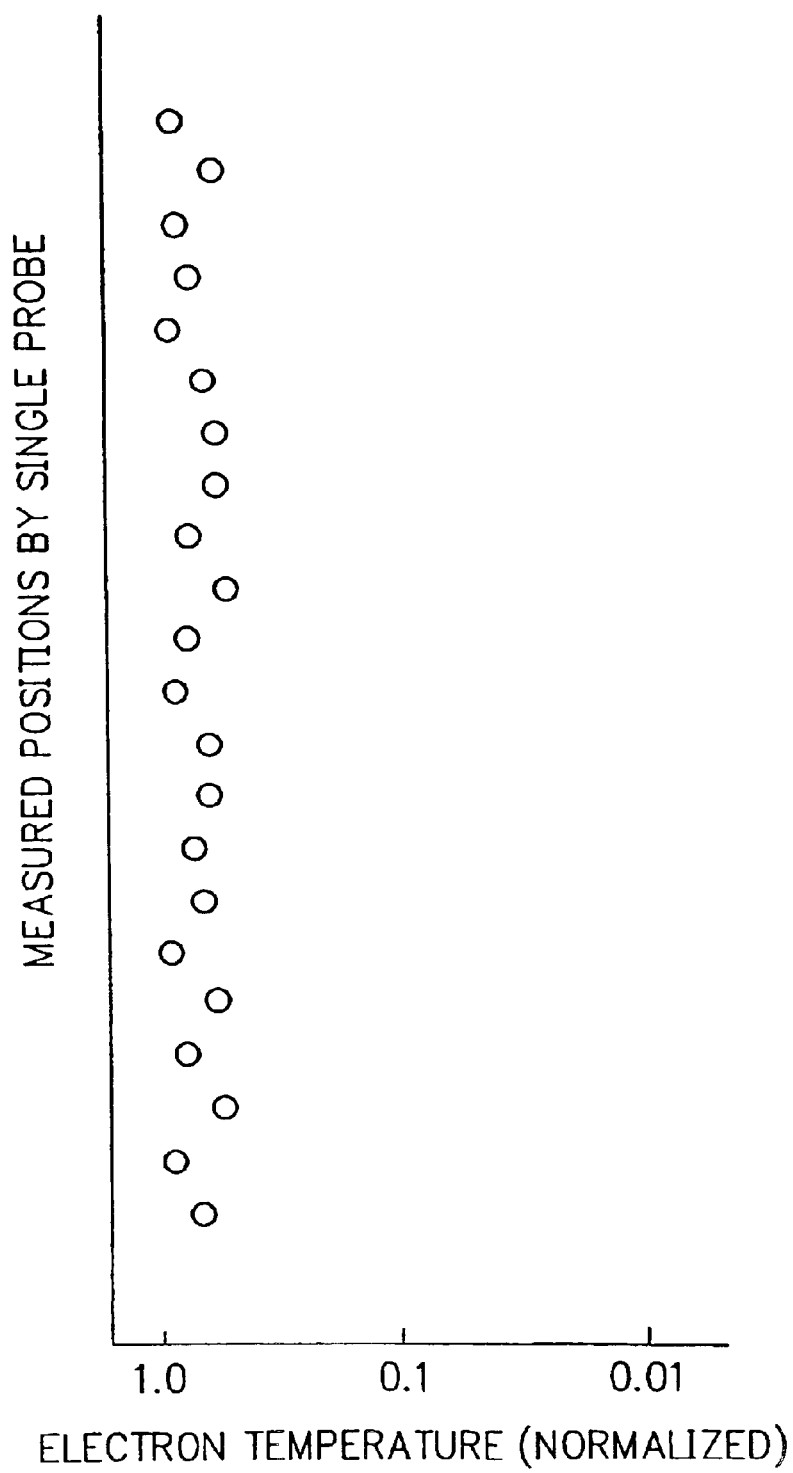

The measured saturated electron currents are graphically shown in FIG. 16. In FIG. 16, the largest saturated electron current is normalized to be 1.

From FIG. 16, the high frequency power introduction means is understood to be substantially uniform for plasmas generated in the glow discharge.

Comparative Experiment 5

In this comparative experiment, as the high frequency power introduction means 102 in the plasma CVD apparatus shown in FIGS. 9(a) and 9(b), there was used a high frequency power introduction means comprising a solid cylindrical metal electrode (having a size which is the same as the outer diameter of the electrode 112 (that is, the inner diameter of the insulating material 111 in other words) of the high frequency power introduction means used in Experiment 4) with no impedance discontinuing pattern.

Distribution state of a plasma generated upon glow discharge in this apparatus was examined in the same manner as in Experiment 4.

Figure 17:
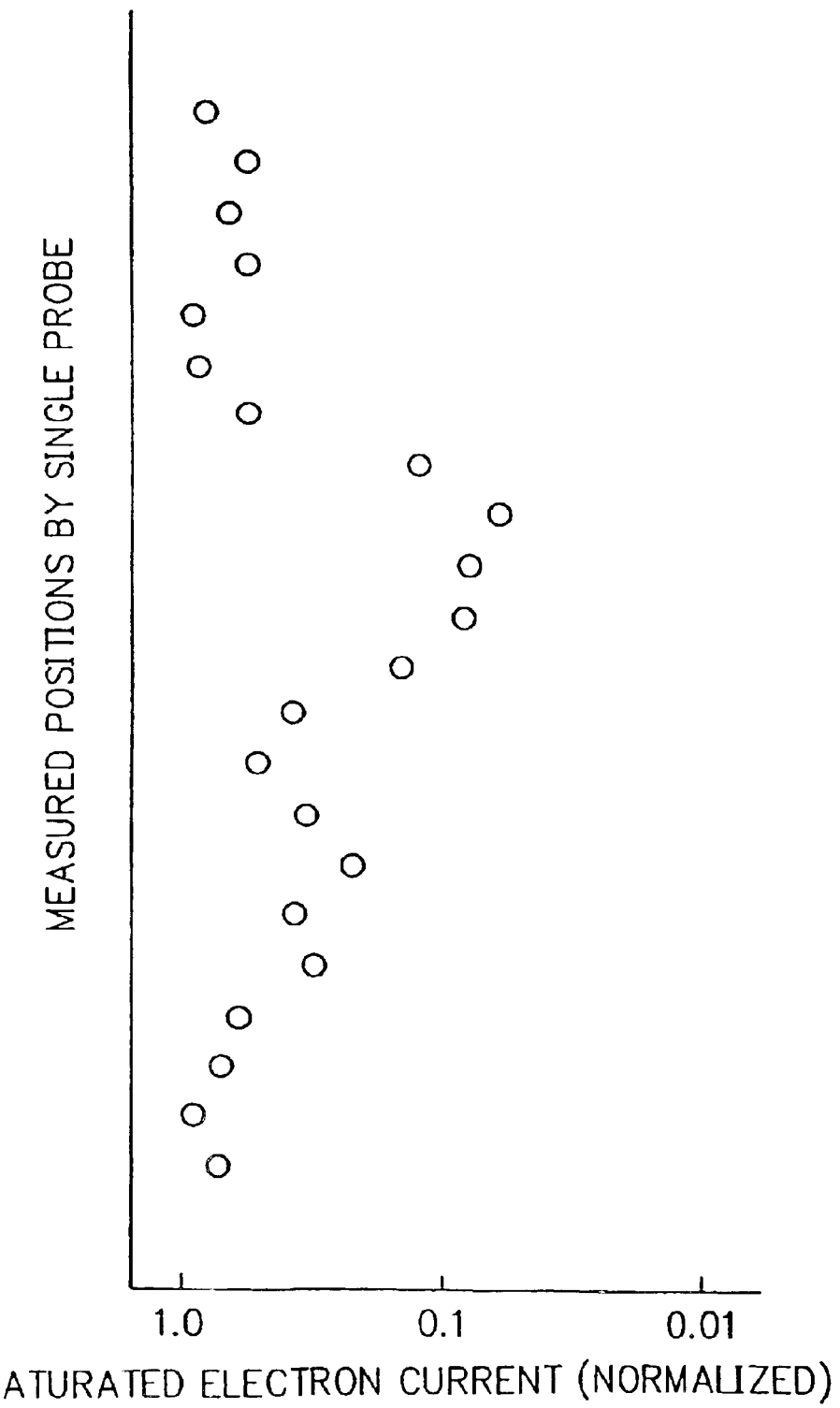

The measured saturated electron currents are graphically shown in FIG. 17. In FIG. 17, the largest saturated electron current is normalized to be 1.

From FIG. 17, the high frequency power introduction means used in this comparative example is understood to be apparently uneven for plasmas generated in the glow discharge.

Comparative Experiment 6

In this comparative experiment, as the high frequency power introduction means 102 in the plasma CVD apparatus shown in FIGS. 9(a) and 9(b), there was used a high frequency power introduction means comprising a modification of the high frequency power introduction means used in Experiment 4 such that the insulating material 111 is omitted.

Distribution state of a plasma generated upon glow discharge in this apparatus was examined in the same manner as in Experiment 4.

Figure 18:
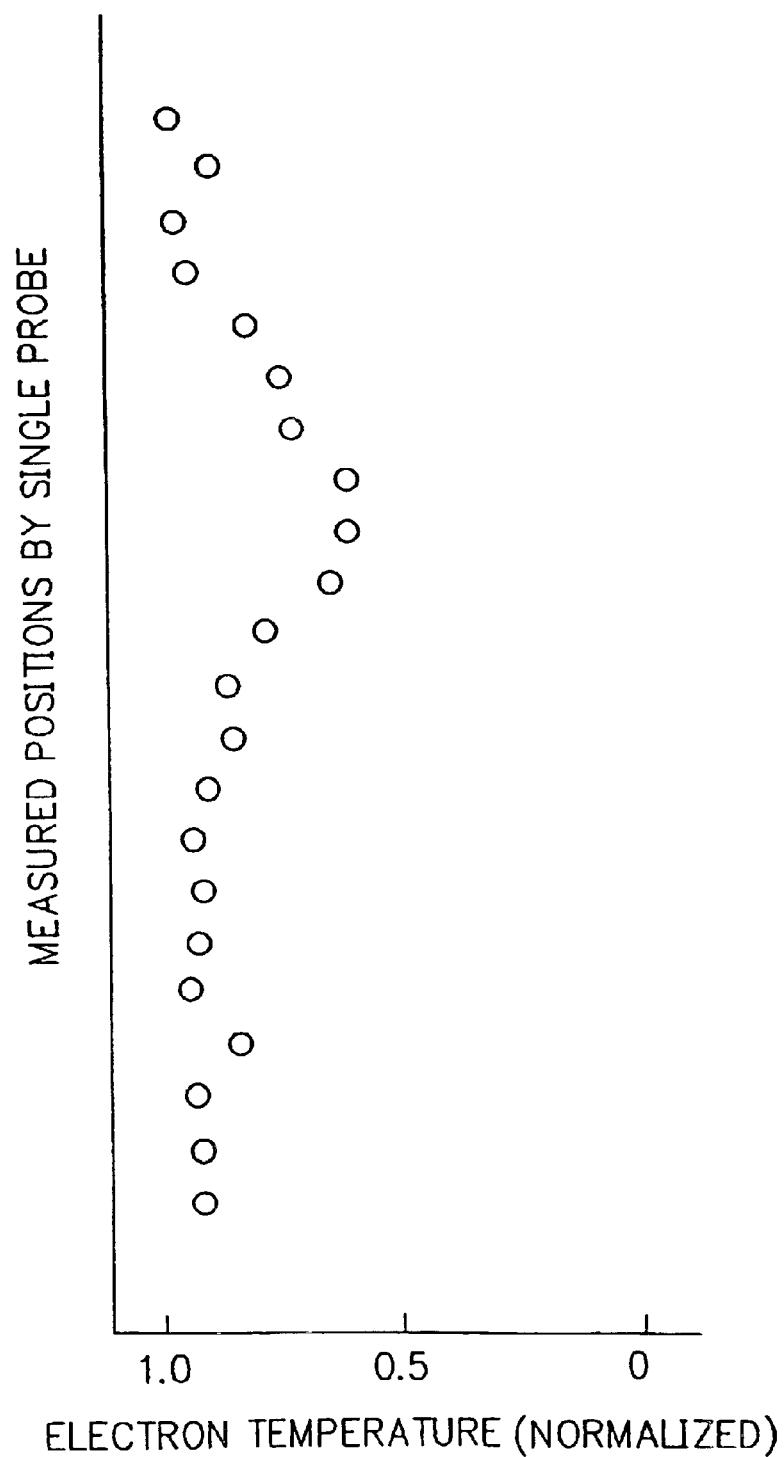

The measured saturated electron currents are graphically shown in FIG. 18. In FIG. 18, the largest saturated electron current is normalized to be 1.

From FIG. 18, the high frequency power introduction means used in this comparative example is understood to be apparently uneven for plasmas generated in the glow discharge.

Comparative Experiment 7

In this comparative experiment, as the high frequency power introduction means 102 in the plasma CVD apparatus shown in FIGS. 9(a) and 9(b), there was used a high frequency power introduction means comprising a modification of the high frequency power introduction means used in Experiment 4 such that a clearance of about 0.5 mm is provided between the insulating material 111 and the electrode 112.

Distribution state of a plasma generated upon glow discharge in this apparatus was examined in the same manner as in Experiment 4.

Figure 19:
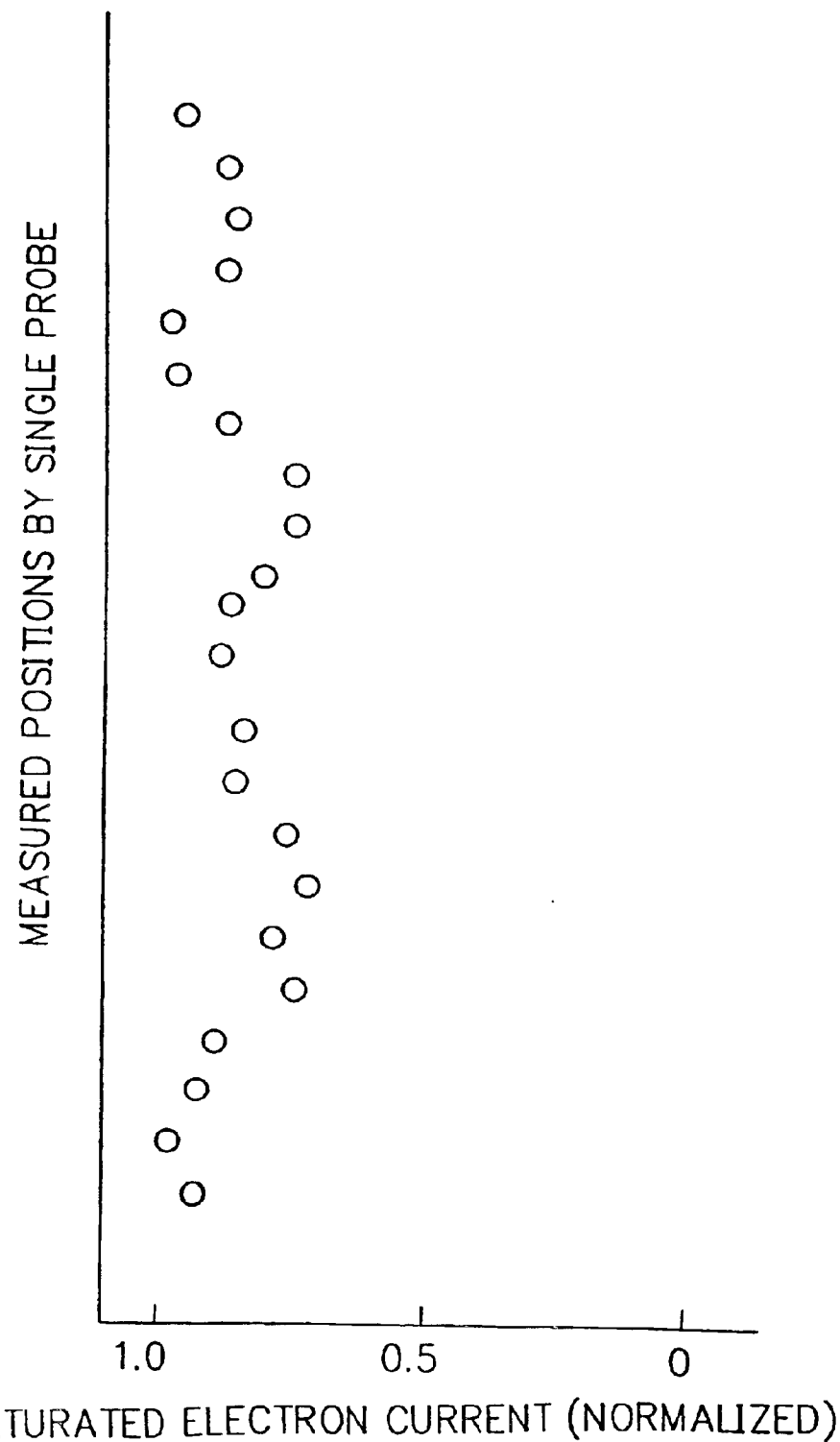

The measured saturated electron currents are graphically shown in FIG. 19. In FIG. 19, the largest saturated electron current is normalized to be 1.

From FIG. 19, the high frequency power introduction means used in this comparative example is understood to be apparently uneven for plasmas generated in the glow discharge.

Experiment 5 and Comparative Experiments 8 and 9

Experiment 5

Figure 20:
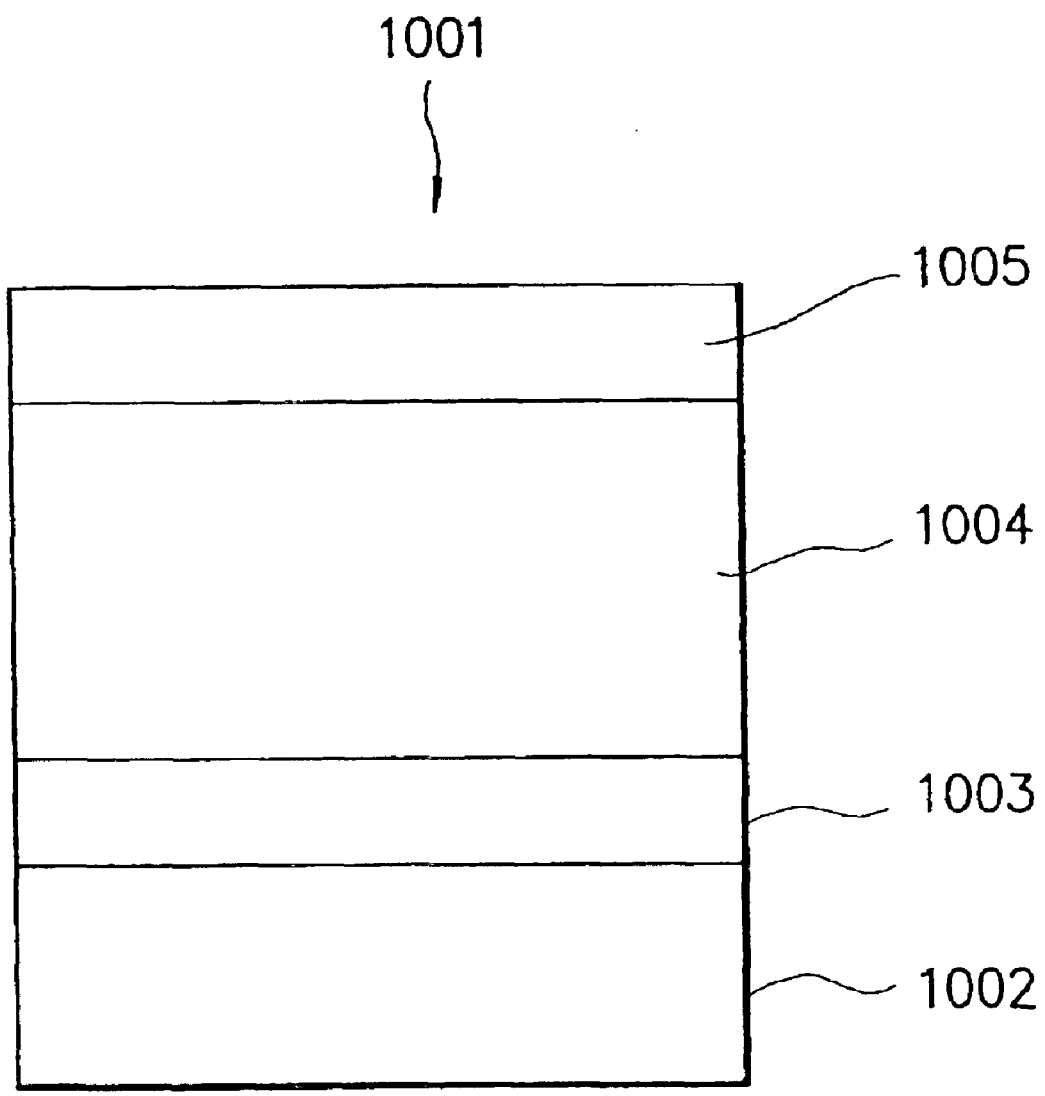

In this experiment, there were prepared eight light receiving members of the configuration shown in FIG. 20. In FIG. 20, reference numeral 1001 indicates a light receiving member comprising a charge injection inhibition layer 1003, a photoconductive layer 1004 and a surface layer 1005 stacked in the named order on a substrate 1002.

Particularly, using the plasma CVD apparatus shown in FIGS. 9(a) and 9(b) having the high frequency power introduction means shown in FIG. 5 according to the present invention, there were prepared said eight light receiving members in accordance with the previously described film-forming procedures using the plasma CVD apparatus shown in FIGS. 9(a) and 9(b) and under film-forming conditions shown in Table 5. It should be noted that the thicknesses mentioned in Table 3 are rough values.

Herein, the charge injection inhibition layer is composed of an amorphous material containing silicon atoms (Si) as a matrix, hydrogen atoms (H) and boron atoms (B), the photoconductive layer is composed of an amorphous material containing silicon atoms (Si) as a matrix, hydrogen atoms (H) and boron atoms (B), and the surface layer is composed of an amorphous material containing silicon atoms (Si), carbon atoms (C) and hydrogen atoms (H).

In this experiment, as the high frequency power introduction means, there were used a plurality of high frequency power introduction means of the configuration shown in FIG. 5 each comprising an electrode 112 (with an impedance discontinuing pattern) having an alumina ceramic material as an insulating material 111 plasma-sprayed to the surface of the electrode 112 in a state with no clearance in which the insulating material 111 has a sandblasted uneven surface (on the glow discharge zone side) of a different surface roughness in the range of from about 1 $\mu$m to about 200 $\mu$m in terms of JIS ten-point average roughness (RZ). And the above film formation for the preparation of the eight light receiving members was conducted for each of these high frequency power introduction means.

For the eight light receiving members obtained in each lot, their surfaces were observed using an optical microscope, wherein the number of a spherical growth defect of more than 10 $\mu$m in diameter present per 10 cm$^2$ was examined. And there was obtained a mean value among the spherical growth defect numbers of the eight light receiving members.

Comparative Example 8

The procedures of Experiment 5 were repeated, except that the plurality of high frequency power introduction means used in Experiment 5 were replaced by a plurality of high frequency power introduction means each comprising a metal electrode (with no impedance discontinuing pattern) having an alumina ceramic material (comprising alumina ceramic material particles of a given mean particle size) plasma-sprayed on the surface of the electrode in which the insulating material has an uneven surface (on the glow discharge zone side) with a different surface roughness (due to the difference in the mean particle size of the alumina ceramic material particles used) in the range of from about 1 $\mu$m to about 200 $\mu$m in terms of JIS ten-point average roughness (RZ), to thereby obtained eight light receiving members for each high frequency power introduction means.

For the eight light receiving members obtained in each lot, their surfaces were observed using an optical microscope, wherein the number of a spherical growth defect of more than 10 $\mu$m in diameter present per 10 cm$^2$ was examined. And there was obtained a mean value among the spherical growth defect numbers of the eight light receiving members.

Comparative Example 9

The procedures of Experiment 5 were repeated, except that the plurality of high frequency power introduction means used in Experiment 5 were replaced by a plurality of high frequency power introduction means each comprising only a metal electrode (with no impedance discontinuing pattern) having no insulating material cover in which the metal electrode has a sandblasted uneven surface (on the glow discharge zone side) of a different surface roughness in the range of from about 1 $\mu$m to about 300 $\mu$m in terms of JIS ten-point average roughness (RZ), to thereby obtained eight light receiving members for each high frequency power introduction means.

For the eight light receiving members obtained in each lot, their surfaces were observed using an optical microscope, wherein the number of a spherical growth defect of more than 10 $\mu$m in diameter present per 10 Cm$^2$ was examined. And there was obtained a mean value among the spherical growth defect numbers of the eight light receiving members.

Evaluation

The results obtained in Experiment 5 and Comparative Examples 8 and 9 are graphically shown in FIG. 21.

The spherical growth defect values in FIG. 21 are values relative to the spherical growth defect value obtained in the case of about 28 $\mu$m in surface roughness in Experiment 5, which is set at 1.

Based on the results shown in FIG. 21, the following facts are understood.

In the case of using a high frequency power introduction means having a roughened surface, there is a tendency in that layer peeling is prevented from occurring and the occurrence of a spherical growth defect is diminished. Especially, as apparent from the results obtained Experiment 5, the use of any of the high frequency power introduction means (having the configuration shown in FIG. 5) having a surface with such surface roughness as above described according to the present invention provides a significant effect of markedly preventing the occurrence of a spherical growth defect.

For the high frequency power introduction means (an alumina ceramic material was simply plasma-sprayed to a metal electrode with no impedance discontinuing pattern) used in Comparative Experiment 8, there is a tendency in that the occurrence of a spherical defect is decreased as the surface roughness is increased to a certain magnitude but when the surface roughness is further increased beyond said magnitude, the occurrence of a spherical defect is increased accordingly. The reason for this is considered such that the adhesion of the plasma-sprayed body with the electrode is weakened as the surface roughness is increased where the plasma-sprayed body is partly peeled from the electrode. Further, in each of Comparative Examples 8 and 9, there was observed the occurrence of sparking during the glow discharge.

Experiment 6

In this experiment, there were prepared a plurality of lots each comprising eight light receiving members of the configuration shown in FIG. 20 comprising a charge injection inhibition layer 1003, a photoconductive layer 1004 and a surface layer 1005 stacked in the named order on a substrate 1002.

Particularly, using the plasma CVD apparatus shown in FIGS. 9(*a*) and 9(*b*) having the high frequency power introduction means shown in FIG. 5 (comprising a metallic electrode 112 with an impedance discontinuing pattern and a titanium dioxide material as an insulating material 111 plasma-sprayed to the surface of the electrode 112 in a state with no clearance) according to the present invention, each lot comprising eight light receiving members was prepared in accordance with the previously described film-forming procedures using the plasma CVD apparatus shown in FIGS. 9(*a*) and 9(*b*) and under film-forming conditions shown in Table 6 wherein a high frequency power with an oscillation frequency of 105 MHz was used and the wattage thereof was varied in the range of from 500 W to 5000 W in the formation of the photoconductive layer in each case. It should be noted that the thicknesses mentioned in Table 6 are rough values.

Evaluation

For the light receiving members obtained in each lot, evaluation was conducted with respect to occurrence of spherical growth defect in their surface, occurrence of uneven image density in the image reproduction, and occurrence of black dot in the image reproduction in the following manner. The evaluated results obtained are collectively shown in Table 7.

(1) Evaluation of the spherical growth defect:

For the eight light receiving members obtained in each lot, their surfaces were observed using an optical microscope, wherein the number of a spherical growth defect of more than 10 μm in diameter present per 10 cm$^2$ was examined. And there was obtained a mean value among the spherical growth defect numbers of the eight light receiving members.

The means value obtained for each lot is shown in Table 7 as a value relative to the mean value obtained for the lot in which the wattage of the high frequency power was made to be 1500 W, which is set at 1.

(2) Evaluation of the occurrence of uneven image density:

For the eight light receiving members obtained in each lot, the evaluation of the occurrence of uneven image density was conducted as follows. Each light receiving member was set to an electrophotographic apparatus NP 6060 modified to be usable for experimental purposes (produced by CANON Kabushiki Kaisha), wherein using a halftone test chart FY9-9042 (produced by CANON Kabushiki Kaisha) as an original, copying shot for an A3-sized paper was conducted to obtain a copy. For the resultant copy, the image density (in terms of optical density) at each of 50 points (areas) randomly selected on the copy was measured by means of a reflection densitometer (produced by Macbeth Company). For the 50 image density values thus measured, a ratio of the minimum image density value to the maximum image density value was obtained. And there was obtained a mean value among the eight ratios (of the minimum image density value/the maximum image density value) obtained for the eight light receiving members in each lot. The means value obtained was made to be an uneven image density for the eight light receiving members in each lot.

The uneven image density value obtained for each lot is shown in Table 7 as a value relative to the uneven image density value obtained for the lot in which the wattage of the high frequency power was made to be 1500 W, which is set at 1.

(3) Evaluation of the occurrence of black dot:

For the eight light receiving members obtained in each lot, the evaluation of the occurrence of black dot was conducted as follows. Each light receiving member was set to the foregoing electrophotographic apparatus NP 6060 (produced by CANON Kabushiki Kaisha), wherein using a halftone test chart FY9-9042 (produced by CANON Kabushiki Raisha) as an original, copying shot for an A3-sized paper was conducted 3000000 times during which after every 10000 copying shots, a white paper (instead of the halftone test chart) was subjected to copying shot. In this way, there were obtained copies from the white papers as the original for the eight light receiving members in each lot.

For the resultant copies from the white papers as the original, evaluation was conducted with respect to black dot occurrence.

The evaluated results obtained for each lot are collectively shown in Table 7 on the basis of the following criteria.

⊚: a case where no black dot is observed in all the copies,

○: a case where no distinguishable black dot is observed in all the copies,

Δ: a case where a few distinguishable black dots are observed in at least one of the copies but these black dots are not such that make minute lines or the like obscure and therefore, are not practically problematic, and X: a case where apparent black dots which make minute lines or the like apparently obscure are observed in at least one of the copies and therefore, they are problematic in practice.

From the results shown in Table 7, it is understood that all the light receiving members are quite satisfactory for all the evaluation items.

Comparative Experiment 10

The procedures of Experiment 6 were repeated, except that the high frequency power introduction means shown in FIG. 5 used in Experiment 6 was replaced by a high frequency power introduction means comprising a modification of the high frequency power introduction means shown in FIG. 5 such that the electrode has no impedance discontinuing pattern, to thereby obtain a plurality of lots each comprising eight light receiving members of the configuration shown in FIG. 20.

For the resultant light receiving members, evaluation was conducted with respect to occurrence of spherical growth defect in their surface, occurrence of uneven image density in the image reproduction, and occurrence of black dot in the image reproduction in the same manner as in Experiment 6. The evaluated results obtained are collectively shown in Table 8. Each of the evaluated values for the uneven image density and the number of a spherical growth defect shown Table 8 is a value relative to the corresponding evaluated value in Experiment 6 where the wattage of the high frequency power was made to be 1500 W, which is set at 1.

Based on the results obtained, there was obtained a finding that the high frequency power introduction means used in this comparative experiment has a tendency in that as the wattage of the high frequency power is increased, the situation for uneven image density to be occurred is improved but the black dot occurrence is slightly increased. For the reason why the black dot occurrence is slightly increased as the wattage of the high frequency power is increased, it is considered such that the irradiation of the high frequency power is somewhat localized and because of this, the high frequency power is partly converged to influence to the growth of a film deposited.

Comparative Experiment 11

The procedures of Experiment 6 were repeated, except that the high frequency power introduction means shown in FIG. 5 used in Experiment 6 was replaced by a high frequency power introduction means comprising a modification of the high frequency power introduction means shown in FIG. 5 such that the insulating material is omitted, to thereby obtain a plurality of lots each comprising eight light receiving members of the configuration shown in FIG. 20.

For the resultant light receiving members, evaluation was conducted with respect to occurrence of spherical growth defect in their surface, occurrence of uneven image density in the image reproduction, and occurrence of black dot in the image reproduction in the same manner as in Experiment 6. The evaluated results obtained are collectively shown in Table 9. Each of the evaluated values for the uneven image density and the number of a spherical growth defect shown Table 9 is a value relative to the corresponding evaluated value in Experiment 6 where the wattage of the high frequency power was made to be 1500 W, which is set at 1.

Based on the results obtained, there was obtained a finding that the high frequency power introduction means used in this comparative experiment has a tendency of not providing a desirable effect of the impedance discontinuing pattern present at the electrode at such extent as in Experiment 6. In addition, as apparent from Table 9, it is understood that the high frequency power introduction means used in this comparative experiment causes a relatively large number of spherical growth defects due to peeling of the film deposited thereon.

Experiment 7

In this experiment, there were prepared a plurality of lots each comprising eight light receiving members of the configuration shown in FIG. 20 comprising a charge injection inhibition layer 1003, a photoconductive layer 1004 and a surface layer 1005 stacked in the named order on a substrate 1002.

Particularly, using the plasma CVD apparatus shown in FIGS. 9(a) and 9(b) having the high frequency power introduction means shown in FIG. 5 (comprising a metallic electrode 112 with an impedance discontinuing pattern and an aluminum nitride material as an insulating material 111 plasma-sprayed to the surface of the electrode 112 in a state with no clearance) according to the present invention, each lot comprising eight light receiving members was prepared in accordance with the previously described film-forming procedures using the plasma CVD apparatus shown in FIGS. 9(a) and 9(b) and under film-forming conditions shown in Table 10 wherein a high frequency power with a different oscillation frequency of 13.56 MHz, 20 MHz, 60 MHz, 105 MHz, 450 MHz or 800 MHz was used in each case (see, Table 11). It should be noted that the thicknesses mentioned in Table 10 are rough values.

For the resultant light receiving members, evaluation was conducted with respect to occurrence of spherical growth defect in their surface, occurrence of uneven image density in the image reproduction, and occurrence of black dot in the image reproduction in the same manner as in Experiment 6. The evaluated results obtained are collectively shown in Table 11.

The mark "X" in Table 11 indicates that glow discharge could not be stably maintained under the condition of 13.56 MHz in oscillation frequency and therefore, no light receiving member could not be prepared.

Based on the results shown in Table 11, it is understood that the light receiving members obtained using a high frequency power with an oscillation frequency in the range of 20 MHz to 450 MHz are quite satisfactory for all the evaluation items. In the case where a high frequency power with an oscillation frequency of 800 MHz was used, though glow discharge could be stably maintained, the matching conditions for the high frequency power could not be stabilized. This is considered to a reason why the light receiving members obtained in this case cased a relatively large uneven image density.

In the following, the present invention will be further described with reference to examples, which are only for illustrative purposes and are not intended to restrict the scope of the present invention.

EXAMPLE 1

In this example, there were prepared eight light receiving members of the configuration shown in FIG. 14.

Particularly, using the plasma CVD apparatus shown in FIGS. 9(a) and 9(b) having the high frequency power introduction means shown in FIG. 1 according to the present invention, there were prepared said eight light receiving members in accordance with the previously described film-forming procedures using the plasma CVD apparatus shown in FIGS. 9(a) and 9(b) and under film-forming conditions shown in Table 12. It should be noted that the thicknesses mentioned in Table 12 are rough values.

Evaluation

For the resultant eight light receiving members, evaluation was conducted with respect to occurrence of spherical growth defect in their surface, unevenness in layer thickness, and occurrence of uneven image density in the image reproduction in the following manner. The evaluated results obtained are collectively shown in Table 13.

(1) Evaluation of the spherical growth defect:

This evaluation was conducted in the same manner as in Experiment 6.

The evaluated result obtained is shown in Table 13.

(2) Evaluation of the unevenness in layer thickness:

For each of the eight light receiving members, the layer thickness at each of 17 points selected at an interval of 2 cm in the generatrix direction of the light receiving member was measured by means of an eddy current type thickness measuring instrument. For the measured results for each measured point of the eight light receiving members, there was obtained a mean value, wherein there were obtained 17 mean values. And of the resultant 17 mean values, a ratio of the minimum mean value to the maximum mean value was obtained. The resultant ratio was made to be an unevenness in layer thickness. The result is shown in Table 13.

(3) Evaluation of the occurrence of uneven image density:

This evaluation was conducted in the same manner as in Experiment 6.

The evaluated result obtained is shown in Table 13.

Comparative Example 1

The procedures of Example 1 were repeated, except that the high frequency power introduction means used in Example 1 was replaced by a high frequency power introduction means comprising a solid metal electrode with a ceramic cover and having a clearance of about 0.5 mm (this clearance is a value in the apparatus designing but does not mean that the actual clearance between the solid metal electrode and the ceramic cover is uniform at said value), to thereby obtained eight light receiving members.

For the resultant eight light receiving members, evaluation was conducted with respect to occurrence of spherical growth defect in.their surface, unevenness in layer thickness, and occurrence of uneven image density in the image reproduction in the same manner as in Example 1. The evaluated results obtained are collectively shown in Table 13.

Comparative Example 2

The procedures of Example 1 were repeated, except that the high frequency power introduction means used in Example 1 was replaced by a high frequency power introduction means comprising a solid metal electrode and an alumina ceramic coated on the surface of the solid metal electrode by means of plasma-spraying, to thereby obtained eight light receiving members.

For the resultant eight light receiving members, evaluation was conducted with respect to occurrence of spherical growth defect in their surface, unevenness in layer thickness, and occurrence of uneven image density in the image reproduction in the same manner as in Example 1. The evaluated results obtained are collectively shown in Table 13.

Total Evaluation

Each of the evaluated values for Comparative Examples 1 and 2 shown in Table 13 is a value relative to the corresponding evaluated value in Example 1, which is set at 1.

From the results shown in Table 13, the following facts are understood. Comparative Example 1 is apparently inferior to Example 1 with respect to the unevenness in layer thickness and the occurrence of uneven image density. Comparative 2 is inferior to Example 1 with respect to the number of a spherical growth defect occurred, though the former is similar to the latter with respect to the unevenness in layer thickness and the occurrence of uneven image density.

EXAMPLE 2

In this example, there were prepared a plurality of lots each comprising eight light receiving members of the configuration shown in FIG. 14.

Particularly, using the plasma CVD apparatus shown in FIGS. 9(a) and 9(b) having the high frequency power introduction means shown in FIG. 1 according to the present invention, each lot comprising eight light receiving members was prepared in accordance with the previously described film-forming procedures using the plasma CVD apparatus shown in FIGS. 9(a) and 9(b) and under film-forming conditions shown in Table 14 wherein a high frequency power with a different oscillation frequency of 20 MHz, 50 MHz, 105 MHz, 200 MHz or 450 MHz (see, Table 15) was used in each case. It should be noted that the thicknesses mentioned in Table 14 are rough values.

For the light receiving members obtained in each lot, evaluation was conducted with respect to occurrence of spherical growth defect in their surface, unevenness in layer thickness, and occurrence of uneven image density in the image reproduction in the same manner as in Example 1. The evaluated results obtained are collectively shown in Table 15.

Each of the valuated values obtained for each lot shown in Table 15 is a value relative to the corresponding evaluated value obtained for the lot in which the oscillation frequency of 105 MHz was used, which is set at 1.

Based on the results shown in Table 15, it is understood that the light receiving members obtained using a high frequency power with an oscillation frequency in the range of 20 MHz to 450 MHz are quite satisfactory for all the evaluation items.

EXAMPLE 3

In this example, there were prepared a plurality of lots each comprising eight light receiving members of the configuration shown in FIG. 14.

Particularly, using the plasma CVD apparatus shown in FIGS. 9(a) and 9(b) having the high frequency power introduction means shown in FIG. 2 (having the metal bar 115 disposed in the cavity of the electrode 112) according to the present invention, each lot comprising eight light receiving members was prepared in accordance with the previously described film-forming procedures using the plasma CVD apparatus shown in FIGS. 9(a) and 9(b) and under film-forming conditions shown in Table 16 wherein a high frequency power with a different oscillation frequency of 20 MHz, 50 MHz, 105 MHz, 200 MHz or 450 MHz (see, Table 17) was used in each case. It should be noted that the thicknesses mentioned in Table 16 are rough values.

For the light receiving members obtained in each lot, evaluation was conducted with respect to occurrence of spherical growth defect in their surface, unevenness in layer thickness, and occurrence of uneven image density in the image reproduction in the same manner as in Example 1. The evaluated results obtained are collectively shown in Table 17.

Each of the valuated values obtained for each lot shown in Table 17 is a value relative to the corresponding evaluated value obtained for the lot in Example 2 in which the oscillation frequency of 105 MHz was used, which is set at 1.

Based on the results shown in Table 17, it is understood that the light receiving members obtained using a high frequency power with an oscillation frequency in the range of 20 MHz to 450 MHz are quite satisfactory for all the evaluation items.

EXAMPLE 4

In this example, there were prepared a plurality of lots each comprising eight light receiving members of the configuration shown in FIG. 14.

Particularly, using the plasma CVD apparatus shown in FIGS. 9(a) and 9(b) having the high frequency power introduction means shown in FIG. 3 (provided with the cooling mechanism) according to the present invention, each lot comprising eight light receiving members was prepared in accordance with the previously described film-forming procedures using the plasma CVD apparatus shown in FIGS. 9(a) and 9(b) and under film-forming conditions shown in Table 18 wherein a high frequency power with a different oscillation frequency of 20 MHz, 50 MHz, 105 MHz, 200 MHz or 450 MHz (see, Table 19) was used in each case. It should be noted that the thicknesses mentioned in Table 18 are rough values.

For the light receiving members obtained in each lot, evaluation was conducted with respect to occurrence of spherical growth defect in their surface, unevenness in layer thickness, and occurrence of uneven image density in the image reproduction in the same manner as in Example 1. The evaluated results obtained are collectively shown in Table 19.

Each of the valuated values obtained for each lot shown in Table 19 is a value relative to the corresponding evaluated value obtained for the lot in Example 2 in which the oscillation frequency of 105 MHz was used, which is set at 1.

Based on the results shown in Table 19, it is understood that the light receiving members obtained using a high frequency power with an oscillation frequency in the range of 20 MHz to 450 MHz are quite satisfactory for all the evaluation items.

EXAMPLE 5

In this example, there were prepared a plurality of lots each comprising eight light receiving members of the configuration shown in FIG. 14.

Particularly, using the plasma CVD apparatus shown in FIGS. 9(a) and 9(b) having the high frequency power introduction means shown in FIG. 3 (in which the cooling mechanism is changed into a heating mechanism using a heating medium) according to the present invention, each lot comprising eight light receiving members was prepared in accordance with the previously described film-forming procedures using the plasma CVD apparatus shown in FIGS. 9(a) and 9(b) and under film-forming conditions shown in Table 20 wherein a high frequency power with a different oscillation frequency of 20 MHz, 50 MHz, 105 MHz, 200 MHz or 450 MHz (see, Table 21) was used in each case. It should be noted that the thicknesses mentioned in Table 20 are rough values.

For the light receiving members obtained in each lot, evaluation was conducted with respect to occurrence of spherical growth defect in their surface, unevenness in layer thickness, and occurrence of uneven image density in the image reproduction in the same manner as in Example 1. The evaluated results obtained are collectively shown in Table 21.

Each of the valuated values obtained for each lot shown in Table 21 is a value relative to the corresponding evaluated value obtained for the lot in Example 2 in which the oscillation frequency of 105 MHz was used, which is set at 1.

Based on the results shown in Table 21, it is understood that the light receiving members obtained using a high frequency power with an oscillation frequency in the range of 20 MHz to 450 MHz are quite satisfactory for all the evaluation items.

EXAMPLE 6

In this example, there were prepared a plurality of lots each comprising eight light receiving members of the configuration shown in FIG. 14.

Particularly, using the plasma CVD apparatus shown in FIGS. 9(a) and 9(b) having the high frequency power introduction means shown in FIG. 4 (provided with the raw material gas introduction mechanism) according to the present invention, each lot comprising eight light receiving members was prepared in accordance with the previously described film-forming procedures using the plasma CVD apparatus shown in FIGS. 9(a) and 9(b) and under film-forming conditions shown in Table 22 wherein a high frequency power with a different oscillation frequency of 20 MHz, 50 MHz, 105 MHz, 200 MHz or 450 MHz (see, Table 23) was used in each case. It should be noted that the thicknesses mentioned in Table 22 are rough values.

For the light receiving members obtained in each lot, evaluation was conducted with respect to occurrence of spherical growth defect in their surface, unevenness in layer thickness, and occurrence of uneven image density in the image reproduction in the same manner as in Example 1. The evaluated results obtained are collectively shown in Table 23.

Each of the valuated values obtained for each lot shown in Table 23 is a value relative to the corresponding evaluated value obtained for the lot in Example 2 in which the oscillation frequency of 105 MHz was used, which is set at 1.

Based on the results shown in Table 23, it is understood that the light receiving members obtained using a high frequency power with an oscillation frequency in the range of 20 MHz to 450 MHz are quite satisfactory for all the evaluation items.

EXAMPLE 7

In this example, there were prepared eight light receiving members of the configuration shown in FIG. 20 in the following manner.

Using the plasma CVD apparatus shown in FIGS. 9(a) and 9(b) having the high frequency power introduction means shown in FIG. 5 (comprising the metallic electrode 112 with an impedance discontinuing pattern and an alumina ceramic material as the insulating material 111 plasma-sprayed to the surface of the electrode 112 in a state with no clearance) according to the present invention, said eight light receiving members were prepared in accordance with the previously described film-forming procedures using the plasma CVD apparatus shown in FIGS. 9(a) and 9(b) and under film-forming conditions shown in Table 24. It should be noted that the thicknesses mentioned in Table 24 are rough values.

For the resultant light receiving members, evaluation was conducted with respect to occurrence of spherical growth defect in their surface, occurrence of uneven image density in the image reproduction, and occurrence of black dot in the image reproduction in the same manner as in Experiment 6. The evaluated results obtained are collectively shown in Table 29.

EXAMPLE 8

In this example, there were prepared eight light receiving members of the configuration shown in FIG. 20 in the following manner.

Using the plasma CVD apparatus shown in FIGS. 9(a) and 9(b) having the high frequency power introduction means shown in FIG. 6 (comprising the metallic electrode 112 with an impedance discontinuing pattern and an alumina ceramic material as the insulating material 111 plasma-sprayed to the surface of the electrode 112 in a state with no clearance) according to the present invention, said eight light receiving members were prepared in accordance with the previously described film-forming procedures using the plasma CVD apparatus shown in FIGS. 9(a) and 9(b) and under film-forming conditions shown in Table 25. It should be noted that the thicknesses mentioned in Table 25 are rough values.

For the resultant light receiving members, evaluation was conducted with respect to occurrence of spherical growth defect in their surface, occurrence of uneven image density in the image reproduction, and occurrence of black dot in the image reproduction in the same manner as in Experiment 6. The evaluated results obtained are collectively shown in Table 29.

EXAMPLE 9

In this example, there were prepared eight light receiving members of the configuration shown in FIG. 20 in the following manner.

Using the plasma CVD apparatus shown in FIGS. 9(a) and 9(b) having the high frequency power introduction means shown in FIG. 7 (comprising the metallic electrode 112 with an impedance discontinuing pattern and a titanium dioxide material as the insulating material 111 plasma-sprayed to the surface of the electrode 112 in a state with no clearance) according to the present invention, said eight light receiving members were prepared in accordance with the previously described film-forming procedures using the plasma CVD apparatus shown in FIGS. 9(a) and 9(b) and under film-forming conditions shown in Table 26. It should be noted that the thicknesses mentioned in Table 26 are rough values.

For the resultant light receiving members, evaluation was conducted with respect to occurrence of spherical growth defect in their surface, occurrence of uneven image density in the image reproduction, and occurrence of black dot in the image reproduction in the same manner as in Experiment 6. The evaluated results obtained are collectively shown in Table 29.

EXAMPLE 10

In this example, there were prepared eight light receiving members of the configuration shown in FIG. 20 in the following manner.

Using the plasma CVD apparatus shown in FIGS. 9(a) and 9(b) having the high frequency power introduction means shown in FIG. 8 (comprising the metallic electrode 112 with an impedance discontinuing pattern and an alumina ceramic material as the insulating material 111 plasma-sprayed to the surface of the electrode 112 in a state with no clearance and having the cooling mechanism) according to the present invention, said eight light receiving members were prepared in accordance with the previously described film-forming procedures using the plasma CVD apparatus shown in FIGS. 9(a) and 9(b) and under film-forming conditions shown in Table 27. It should be noted that the thicknesses mentioned in Table 27 are rough values.

For the resultant light receiving members, evaluation was conducted with respect to occurrence of spherical growth defect in their surface, occurrence of uneven image density in the image reproduction, and occurrence of black dot in the image reproduction in the same manner as in Experiment 6. The evaluated results obtained are collectively shown in Table 29.

EXAMPLE 11

In this example, there were prepared eight light receiving members of the configuration shown in FIG. 20 in the following manner.

Using the plasma CVD apparatus shown in FIGS. 22(a) and 22(b) having the high frequency power introduction means shown in FIG. 8 (comprising the metallic electrode 112 with an impedance discontinuing pattern and an alumina ceramic material as the insulating material 111 plasma sprayed to the surface of the electrode 112 in a state with no clearance and having the cooling mechanism) according to the present invention, said eight light receiving members were prepared in accordance with the previously described film-forming procedures using the plasma CVD apparatus shown in FIGS. 22(a) and 22(b) and under film-forming conditions shown in Table 28. It should be noted that the thicknesses mentioned in Table 28 are rough values.

For the resultant light receiving members, evaluation was conducted with respect to occurrence of spherical growth defect in their surface, occurrence of uneven image density in the image reproduction, and occurrence of black dot in the image reproduction in the same manner as in Experiment 6. The evaluated results obtained are collectively shown in Table 29.

Total Evaluation

Each of the valuated values for the number of a spherical growth defect and the uneven image density obtained in each of Examples 8 to 11 shown in Table 29 is a value relative to the corresponding evaluated value obtained in Example 7, which is set at 1.

Based on the results shown in Table 29, it is understood that the light receiving members obtained in Examples 7 to 11 are quite satisfactory for all the evaluation items.

As apparent from the above description, the high frequency power introduction means according to the present invention provides various significant advantages.

Particularly, because the surface thereof to be exposed to a plasma generated in the glow discharge zone is covered by a insulating base material, the adhesion of a film deposited thereon is good enough, where problems due to layer peeling are not occurred. In addition, because the electrode is covered by said insulating material in such structure that the impedance is discontinued, the impedance discontinuing face effectively acts with the face of reflecting a high frequency power to unify the distribution of a high frequency power. By this, even in the case where the electrode of the high frequency power introduction means is made to have a complicated structure with an impedance discontinuing pattern, the occurrence of sparking is effectively prevented. Further, by forming the electrode such a manner that it is joined to the inside of the insulating material in a state with no clearance between them, the occurrence of an uneven high frequency power distribution due to the clearance between the electrode and the insulating cover which is found in the prior art is effectively prevented.

According to the present invention, not only the occurrence of layer peeling for a film deposited on the surface of a high frequency power introduction means but also the occurrence of localization of a plasma generated are effectively prevented. This makes it possible to effectively form various high quality deposited films while effectively preventing not only the occurrence a spherical growth defect but also the occurrence of an unevenness in layer thickness. This enables to efficiently produce a high quality light receiving member, particularly, a high quality electrophotographic light receiving member excelling in image-forming characteristics and which reproduces a high quality image with an improved uniform image density and with neither minute blank area nor black dot.

The present invention is not limited to the foregoing experiments and examples but it can be optionally modified in a range where the principle of the present invention is not hindered. It is a matter of cause that the product produced according to the present invention is not limited to an electrophotographic light receiving member.

However, the present invention is quite suitable for the production of an electrophotographic light receiving member in which the deposition of a large area deposited film having a homogenous property is desired to be formed at a high speed.

TABLE 1

| raw material gas and flow rate $SiH_4$ (sccm) | 250 |
|---|---|
| substrate temperature (° C.) | 280 |
| inner pressure (Pa) | 2 |
| high frequency power (w) | 4000 |
| oscillation frequency (MHz) | 105 |

TABLE 2

| raw material gas and flow rate $SiH_4$ (sccm) | 200 |
|---|---|
| substrate temperature (° C.) | 230 |
| inner pressure (Pa) | 1 |
| high frequency power (w) | 3000 |
| oscillation frequency (MHz) | 105 |

TABLE 3

| constituent layer | charge injection inhibition layer | photoconductive layer | surface layer |
|---|---|---|---|
| raw material gas and flow rate | | | |
| $SiH_4$ (sccm) | 500 | 1000 | 120 |
| $H_2$ (sccm) | 500 | | |
| $B_2H_6$ (ppm) (against $SiH_4$) | 1000 | 2 | |
| $CH_4$ (sccm) | | | 500 |
| substrate temperature (° C.) | 250 | 250 | 250 |
| inner pressure (Pa) | 6 | 4 | 4 |
| high frequency power (w) (105 MHz) | 5000 | 6000 | 3000 |
| layer thickness (μm) | 3 | 30 | 0.5 |

TABLE 4

| raw material gas and flow rate $SiH_4$ (sccm) | 25 |
|---|---|
| substrate temperature (° C.) | 280 |
| inner pressure (Pa) | 2 |
| high frequency power (w) | 500 |
| oscillation frequency (MHz) | 105 |

TABLE 5

| constituent layer | charge injection inhibition layer | photoconductive layer | surface layer |
|---|---|---|---|
| raw material gas and flow rate | | | |
| $SiH_4$ (sccm) | 500 | 250 | 80 |
| $H_2$ (sccm) | 500 | | |
| $B_2H_6$ (ppm) (against $SiH_4$) | 1000 | 2 | |
| $CH_4$ (sccm) | | | 500 |
| substrate temperature (° C.) | 250 | 250 | 250 |
| inner pressure (Pa) | 6 | 4 | 4 |
| high frequency power (w) (105 MHz) | 2500 | 2500 | 1000 |
| layer thickness (μm) | 3 | 30 | 0.5 |

TABLE 6

| constituent layer | charge injection inhibition layer | photoconductive layer | surface layer |
|---|---|---|---|
| raw material gas and flow rate | | | |
| $SiH_4$ (sccm) | 150 | 200 | 20 |
| $B_2H_6$ (ppm) (against $SiH_4$) | 1000 | 0.2 | |
| $CH_4$ (sccm) | | | 200 |
| substrate temperature (° C.) | 210 | 210 | 210 |
| inner pressure (Pa) | 6 | 4 | 4 |
| high frequency power (w) (105 MHz) | 1500 | changed | 1000 |
| layer thickness (μm) | 3 | 30 | 0.5 |

TABLE 7

| high frequency power (w) | 500 | 1000 | 1500 | 2000 | 3000 | 5000 |
|---|---|---|---|---|---|---|
| unevenness in image density | 0.96 | 0.92 | 1 | 1.03 | 1.06 | 0.98 |
| No. of spherical growth defect | 1.05 | 1.05 | 1 | 0.95 | 0.92 | 1.04 |
| appearance of black dot | ⊚ | ⊚ | ⊚ | ⊚ | ⊚ | ⊚ |

TABLE 8

| high frequency power (w) | 500 | 1000 | 1500 | 2000 | 3000 | 5000 |
|---|---|---|---|---|---|---|
| unevenness in image density | 0.79 | 0.81 | 0.82 | 0.87 | 0.95 | 0.98 |
| No. of spherical growth defect | 1.06 | 1.02 | 0.96 | 1.05 | 0.98 | 1.03 |
| appearance of black dot | ⊚ | ⊚ | ○ | ○ | ○ | ○ |

TABLE 9

| high frequency power (w) | 500 | 1000 | 1500 | 2000 | 3000 | 5000 |
|---|---|---|---|---|---|---|
| unevenness in image density | 0.86 | 0.87 | 0.89 | 0.91 | 0.92 | 0.96 |
| No. of spherical growth defect | 5.3 | 4.6 | 4.8 | 4.3 | 4.7 | 5.1 |
| appearance of black dot | ⊚ | ⊚ | ⊚ | ⊚ | ○ | ○ |

TABLE 10

| constituent layer | charge injection inhibition layer | photoconductive layer | surface layer |
|---|---|---|---|
| raw material gas and flow rate | | | |
| SiH$_4$ (sccm) | 250 | 200 | 20 |
| B$_2$H$_6$ (ppm) (against SiH$_4$) | 1000 | 0.2 | |
| CH$_4$ (sccm) | | | 200 |
| substrate temperature (° C.) | 210 | 210 | 210 |
| inner pressure (Pa) | 2 | 2 | 2 |
| high frequency power (w) (105 MHz) | 1500 | 1500 | 500 |
| layer thickness (μm) | 3 | 20 | 0.5 |

TABLE 11

| oscillation frequency (MHz) | 13.56 | 20 | 60 | 105 | 450 | 800 |
|---|---|---|---|---|---|---|
| unevenness in image density | x | 1.03 | 0.95 | 1 | 0.92 | 0.63 |
| No. of spherical growth defect | x | 1.08 | 1.03 | 1 | 1.06 | 0.95 |
| appearance of black dot | x | ⊚ | ⊚ | ⊚ | ⊚ | ⊚ |

TABLE 12

| constituent layer | charge injection inhibition layer | photoconductive layer | surface layer |
|---|---|---|---|
| raw material gas and flow rate | | | |
| SiH$_4$ (sccm) | 500 | 350 | 120 |
| B$_2$H$_6$ (ppm) (against SiH$_4$) | 500 | 1 | |
| CH$_4$ (sccm) | | | 700 |
| substrate temperature (° C.) | 300 | 300 | 150 |
| inner pressure (Pa) | 5 | 3 | 2 |
| high frequency power (w) (105 MHz) | 5000 | 5000 | 3000 |
| layer thickness (μm) | 5 | 30 | 0.5 |

TABLE 13

| | Example 1 | Comparative Example 1 | Comparative Example 2 |
|---|---|---|---|
| No of spherical growth defect | 1 | 1.1 | 3.8 |
| unevenness in layer thickness | 1 | 0.76 | 1.05 |
| unevenness in image density | 1 | 0.68 | 0.98 |

TABLE 14

| constituent layer | charge injection inhibition layer | photoconductive layer | surface layer |
|---|---|---|---|
| raw material gas and flow rate | | | |
| SiH$_4$ (sccm) | 300 | 350 | 120 |
| B$_2$H$_6$ (ppm) (against SiH$_4$) | 1000 | 1 | |
| CH$_4$ (sccm) | | | 1000 |
| substrate temperature (° C.) | 350 | 350 | 350 |
| inner pressure (Pa) | 5 | 3 | 2 |
| high frequency power (w) (oscillation frequency changed) | 3000 | 3000 | 3000 |
| layer thickness (μm) | 2 | 15 | 0.5 |

TABLE 15

| oscillation frequency (MHz) | 20 | 50 | 105 | 200 | 450 |
|---|---|---|---|---|---|
| No. of spherical growth defect | 1.1 | .095 | 1 | 1 | 0.95 |
| unevenness in layer thickness | 0.98 | 1.03 | 1 | 0.98 | 1.02 |
| unevenness in image density | 1.06 | 1.02 | 1 | 0.97 | 1.03 |

TABLE 16

| constituent layer | charge injection inhibition layer | photoconductive layer | surface layer |
|---|---|---|---|
| raw material gas and flow rate | | | |
| $SiH_4$ (sccm) | 600 | 500 | 300 |
| $B_2H_6$ (ppm) (against $SiH_4$) | 1000 | 3 | |
| $CH_4$ (sccm) | | | 1000 |
| substrate temperature (° C.) | 350 | 350 | 350 |
| inner pressure (Pa) | 3 | 3 | 2 |
| high frequency power (w) (oscillation frequency changed) | 4000 | 5000 | 5000 |
| layer thickness (μm) | 2 | 15 | 0.5 |

TABLE 17

| oscillation frequency (MHz) | 20 | 50 | 105 | 200 | 450 |
|---|---|---|---|---|---|
| No. of spherical growth defect | 0.95 | 0.95 | 1.05 | 1.05 | 0.95 |
| unevenness in layer thickness | 0.96 | 0.98 | 0.98 | 1.02 | 0.97 |
| unevenness in image density | 0.98 | 1.04 | 1.02 | 0.97 | 1.01 |

TABLE 18

| constituent layer | charge injection inhibition layer | photoconductive layer | surface layer |
|---|---|---|---|
| raw material gas and flow rate | | | |
| $SiH_4$ (sccm) | 250 | 750 | 300 |
| $B_2H_6$ (ppm) (against $SiH_4$) | 700 | 0.5 | |
| $CH_4$ (sccm) | | | 1000 |
| substrate temperature (° C.) | 280 | 280 | 150 |
| inner pressure (Pa) | 3 | 3 | 1 |
| high frequency power (w) (oscillation frequency changed) | 3000 | 3000 | 3500 |
| layer thickness (μm) | 3 | 25 | 0.5 |

TABLE 19

| oscillation frequency (MHz) | 20 | 50 | 105 | 200 | 450.00 |
|---|---|---|---|---|---|
| No. of spherical growth defect | 0.95 | 1 | 1 | 1 | 0.95 |
| unevenness in layer thickness | 1.01 | 1.01 | 0.96 | 1.01 | 0.99 |
| unevenness in image density | 0.96 | 1.02 | 1.03 | 0.95 | 1.01 |

TABLE 20

| constituent layer | charge injection inhibition layer | photoconductive layer | surface layer |
|---|---|---|---|
| raw material gas and flow rate | | | |
| $SiH_4$ (sccm) | 250 | 300 | 150 |
| $B_2H_6$ (ppm) (against $SiH_4$) | 700 | 0.5 | |
| $CH_4$ (sccm) | | | 650 |
| substrate temperature (° C.) | 280 | 280 | 150 |
| inner pressure (Pa) | 3 | 3 | 1 |
| high frequency power (w) (oscillation frequency changed) | 500 | 800 | 500 |
| layer thickness (μm) | 3 | 25 | 0.5 |

TABLE 21

| oscillation frequency (MHz) | 20 | 50 | 105 | 200 | 450 |
|---|---|---|---|---|---|
| No. of spherical growth defect | 0.95 | 1 | 0.95 | 1 | 1.05 |
| unevenness in layer thickness | 1.01 | 0.98 | 0.98 | 1.01 | 0.97 |
| unevenness in image density | 1.01 | 0.95 | 1.01 | 0.98 | 0.98 |

TABLE 22

| constituent layer | charge injection inhibition layer | photoconductive layer | surface layer |
|---|---|---|---|
| raw material gas and flow rate | | | |
| $SiH_4$ (sccm) | 100 | 250 | 80 |
| $B_2H_6$ (ppm) (against $SiH_4$) | 500 | 0.5 | |
| $CH_4$ (sccm) | | | 500 |
| substrate temperature (° C.) | 250 | 250 | 220 |
| inner pressure (Pa) | 3 | 3 | 3 |
| high frequency power (w) (oscillation frequency changed) | 3000 | 3000 | 3500 |
| layer thickness (μm) | 1.5 | 25 | 0.5 |

TABLE 23

| oscillation frequency (MHz) | 20 | 50 | 105 | 200 | 450 |
|---|---|---|---|---|---|
| No. of spherical growth defect | 1 | 0.95 | 1 | 1 | 0.95 |
| unevenness in layer thickness | 0.98 | 1.01 | 1.02 | 1.01 | 1.04 |
| unevenness in image density | 0.96 | 0.98 | 1.03 | 1.03 | 0.96 |

TABLE 24

| constituent layer | charge injection inhibition layer | photoconductive layer | surface layer |
|---|---|---|---|
| raw material gas and flow rate | | | |
| $SiH_4$ (sccm) | 350 | 350 | 120 |
| $H_2$ (sccm) | | | |
| $B_2H_6$ (ppm) (against $SiH_4$) | 500 | 1 | |
| $CH_4$ (sccm) | | | 700 |
| NO (sccm) | 15 | | |
| substrate temperature (° C.) | 300 | 300 | 150 |
| inner pressure (Pa) | 5 | 3 | 3 |
| high frequency power (w) (60 MHz) | 2000 | 2000 | 1000 |
| layer thickness (μm) | 3 | 20 | 0.5 |

TABLE 25

| constituent layer | charge injection inhibition layer | photoconductive layer | surface layer |
|---|---|---|---|
| raw material gas and flow rate | | | |
| $SiH_4$ (sccm) | 100 | 100 | 20 |
| $H_2$ (sccm) | | | |
| $B_2H_6$ (ppm) (against $SiH_4$) | 300 | 0.1 | |
| $CH_4$ (sccm) | | | 100 |
| substrate temperature (° C.) | 250 | 250 | 250 |
| inner pressure (Pa) | 2 | 2 | 2 |
| high frequency power (w) (105 MHz) | 2000 | 2000 | 600 |
| layer thickness (μm) | 2 | 15 | 0.5 |

TABLE 26

| constituent layer | charge injection inhibition layer | photoconductive layer | surface layer |
|---|---|---|---|
| raw material gas and flow rate | | | |
| $SiH_4$ (sccm) | 300 | 300 | 300 |
| $H_2$ (sccm) | | | |
| $B_2H_6$ (ppm) (against $SiH_4$) | 1000 | 3 | |
| $CH_4$ (sccm) | | | 1000 |
| substrate temperature (° C.) | 350 | 350 | 350 |
| inner pressure (Pa) | 3 | 3 | 2 |
| high frequency power (w) (105 MHz) | 3000 | 5000 | 1800 |
| layer thickness (μm) | 2 | 20 | 0.5 |

TABLE 27

| constituent layer | charge injection inhibition layer | photoconductive layer | surface layer |
|---|---|---|---|
| raw material gas and flow rate | | | |
| $SiH_4$ (sccm) | 300 | 300 | 300 |
| $H_2$ (sccm) | | | |
| $B_2H_6$ (ppm) (against $SiH_4$) | 1000 | 3 | |
| $CH_4$ (sccm) | | | 1000 |
| substrate temperature (° C.) | 350 | 350 | 350 |
| inner pressure (Pa) | 3 | 3 | 2 |
| high frequency power (w) (105 MHz) | 3000 | 5000 | 1800 |
| layer thickness (μm) | 2 | 20 | 0.5 |

TABLE 28

| constituent layer | charge injection inhibition layer | photoconductive layer | surface layer |
|---|---|---|---|
| raw material gas and flow rate | | | |
| $SiH_4$ (sccm) | 300 | 300 | 300 |
| $H_2$ (sccm) | | | |
| $B_2H_6$ (ppm) (against $SiH_4$) | 3000 | 3 | |
| $CH_4$ (sccm) | | | 1000 |
| NO (sccm) | 15 | | |
| substrate temperature (° C.) | 350 | 350 | 350 |
| inner pressure (Pa) | 3 | 3 | 2 |
| high frequency power (w) (105 MHz) | 3000 | 5000 | 1800 |
| layer thickness (μm) | 2 | 20 | 0.5 |

TABLE 29

| | Example 7 | Example 8 | Example 9 | Example 10 | Example 11 |
|---|---|---|---|---|---|
| No. of spherical growth defect | 1 | 0.95 | 1.05 | 1.08 | 0.98 |
| unevenness in image density | 1 | 0.98 | 0.96 | 1.02 | 0.98 |
| appearance of black dot | ⊚ | ⊚ | ⊚ | ⊚ | ⊚ |

What is claimed is:

1. A deposited film-forming process for forming under vacuum a deposited film on a substrate arranged in a reaction chamber and having a glow discharge region by introducing a raw material gas into said reaction chamber and introducing a high frequency power into said reaction chamber to cause glow discharge in said glow discharge region of said reaction chamber thereby forming said deposited film on said substrate, comprising:

introducing said high frequency power into said reaction chamber employing a high frequency power introduction means having an electrode for transmitting said high frequency power; and providing a region where impedance is discontinuous by employing the electrode which comprises electrically conductive metallic material and being patterned in a configuration which is branched into plural portions such that the region where impedance is discontinuous is provided so as to generate a uniform supply of said high frequency power to said reaction chamber, said high frequency power introduction means has (i) a first insulating surface in contact with said electrode such that there is no clearance between said electrically conductive metallic material constituting said electrode and said first insulating surface and (ii) a second insulating surface for insulating said electrically conductive metallic material constituting said electrode from said glow discharge region of said reaction chamber.

2. The deposited film-forming process according to claim 1, wherein said high frequency power is of an oscillation frequency in a range of from 20 MHz to 450 MHz.

3. The deposited film-forming process according to claim 1, wherein said high frequency power introduction means is cooled.

4. The deposited film-forming process according to claim 1, wherein said high frequency power introduction means is heated.

5. The deposited film-forming process according to claim 1, wherein said substrate arranged in said reaction chamber comprises a plurality of cylindrical substrates and said plurality of cylindrical substrates are spacedly and concentrically arranged so as to circumscribe said glow discharge region.

6. The deposited film-forming process according to claim 1, wherein said first insulating surface (i) and said second insulating surface (ii) comprise a ceramic material.

7. The deposited film-forming process according to claim 6, wherein said ceramic material is an alumina ceramic material.

8. The deposited film-forming process according to claim 1, wherein a portion of said second insulating surface (ii) is exposed to said glow discharge caused in said glow discharge region of said reaction chamber and said portion has a surface roughness of 5 to 200 $\mu$m in terms of JIS ten-point average roughness (RZ) under JIS B0601.

* * * * *

UNITED STATES PATENT AND TRADEMARK OFFICE
CERTIFICATE OF CORRECTION

PATENT NO.     : 6,767,593 B2
DATED          : July 27, 2004
INVENTOR(S)    : Kazuyoshi Akiyama It is certified that error appears in the above-identified patent and that said Letters Patent is hereby corrected as shown below:

Column 7,
Line 22, "thereof" should read -- thereof. --.

Column 25,
Lines 8 and 28, "10cm$_2$" should read -- 10cm$^2$ --.

Column 28,
Line 56, "10Cm$^2$" should read -- 10cm$^2$ --.

Column 31,
Line 25, "be occurred" should read -- occur --.

Column 40,
Table 4, "25" should read -- 250 --.

Signed and Sealed this

Thirtieth Day of November, 2004

JON W. DUDAS
*Director of the United States Patent and Trademark Office*